(12) United States Patent
Frayssinet et al.

(10) Patent No.: US 8,030,101 B2
(45) Date of Patent: Oct. 4, 2011

(54) PROCESS FOR PRODUCING AN EPITAXIAL LAYER OF GALIUM NITRIDE

(75) Inventors: Eric Frayssinet, Mougins (FR);
Bernard Beaumont, Le Tignet (FR);
Jean-Pierre Faurie, Valbonne (FR);
Pierre Gibart, Charcarncuf Grasse (FR)

(73) Assignee: Saint-Gobain Cristaux et Detecteurs, Courbevoie (FR)

( * ) Notice: Subject to any disclaimer, the term of this patent is extended or adjusted under 35 U.S.C. 154(b) by 61 days.

(21) Appl. No.: 12/467,986

(22) Filed: May 18, 2009

(65) Prior Publication Data
US 2010/0001289 A1    Jan. 7, 2010

Related U.S. Application Data

(63) Continuation of application No. 11/519,702, filed on Sep. 11, 2006, now Pat. No. 7,560,296, which is a continuation-in-part of application No. 10/695,724, filed on Oct. 28, 2003, now Pat. No. 7,118,929, which is a continuation-in-part of application No. 09/960,829, filed on Sep. 21, 2001, now Pat. No. 6,802,902, which is a continuation of application No. 09/530,050, filed on Jul. 7, 2000, now Pat. No. 6,325,850.

(60) Provisional application No. 60/751,387, filed on Dec. 15, 2005.

(30) Foreign Application Priority Data

Oct. 20, 1997    (FR) ...................................... 97 13096

(51) Int. Cl.
*H01L 21/00* (2006.01)

(52) U.S. Cl. ................ 438/22; 438/24; 438/27; 438/29; 257/E21.108; 257/E21.097; 257/E21.09; 257/E21.46; 257/E21.461

(58) Field of Classification Search ................ 438/22, 438/24, 27, 29–32
See application file for complete search history.

(56) References Cited

U.S. PATENT DOCUMENTS

| 6,051,849 A * | 4/2000 | Davis et al. .................. 257/103 |
| 6,319,742 B1 | 11/2001 | Hayashi et al. |
| 6,440,823 B1 | 8/2002 | Vaudo et al. |
| 6,475,882 B1 | 11/2002 | Sakai et al. |

(Continued)

FOREIGN PATENT DOCUMENTS

| EP | 0506146 A2 | 4/1981 |
| WO | PCT/FR03/002340 | 7/2003 |

OTHER PUBLICATIONS

"Selective area epitaxy of GaN for electron field emission devices," D. Kapolnek, et al., Journal of Crystal Growth 170 (1997) pp. 340-343.

(Continued)

*Primary Examiner* — Hsien Ming Lee
(74) *Attorney, Agent, or Firm* — Abel Law Group, LLP

(57) ABSTRACT

A method of manufacturing a low defect density GaN material comprising at least two steps of growing epitaxial layers of GaN with differences in growing conditions, (a.) a first step of growing an epitaxial layer GaN on an epitaxially competent layer under first growing conditions selected to induce island features formation, followed by (b.) a second step of growing an epitaxial layer of GaN under second growing conditions selected to enhance lateral growth until coalescence.

27 Claims, 15 Drawing Sheets

U.S. PATENT DOCUMENTS

| | | |
|---|---|---|
| 6,608,327 B1 | 8/2003 | Davis et al. |
| 6,794,276 B2 | 9/2004 | Letertre et al. |
| 6,852,161 B2 | 2/2005 | Urashima et al. |
| 7,189,588 B2 | 3/2007 | Usui et al. |
| 2002/0011599 A1 | 1/2002 | Motoki et al. |
| 2002/0048964 A1 | 4/2002 | Yuasa et al. |
| 2002/0096674 A1 | 7/2002 | Cho et al. |
| 2006/0099781 A1* | 5/2006 | Beaumont et al. ............ 438/509 |

OTHER PUBLICATIONS

"Selective growth of wurtzite GaN and $Al_xGa_{1-x}N$ on GaN/sapphire substrates by metalorganic vapor phase epitaxy," Y. Kato, et al., Journal of Crystal Grown 144 (1994) 133-140.

"The effect of the Si/N treatment of a nitridated sapphire surface on the growth mode of GaN in low-pressure metalorganic vapor phase epitaxy," S. Haffouz, et al., 1998 American Institute of Physics, vol. 73, No. 9, Aug. 31, 1998, pp. 1278-1280.

"Influence of in situ sapphire surface preparation and carrier gas on the growth mode of GaN in MOVPE," P. Vennegues, et al., Journal of Crystal Growth, 1998, pp. 167-177.

"Effect of Magnesium and Silicon on the lateral overgrowth of GaN patterned substrates by Metal Organic Vapor Phase Epitaxy," S. Haffouz, et al., MRS Internet Journal Nitride Semiconductor Research, 1998, pp. 1-6.

"Growth of high-quality GaN by low-pressure metal-organic vapour phase epitaxy (LP-MOVPE) from 3D islands and lateral overgrowth," H. Lahreche, et al., Journal of Crystal Growth, 1999, pp. 245-252.

"Anti-Surfactant in III-Nitride Expitaxy—Quantum Dot Formation and dislocation Termination -," S. Tanaka, et al., Appl. Phys. vol. 39 (2000) pp. L831-L834.

"Reduction mechanisms for. defect densities in GaN using one- or two-step epitaxial lateral overgrowth methods," P. Vennegues, et al., Journal of Applied Physics, vol. 87, No. 9, May 1, 2000, pp. 4175-4181.

"The effect of $H_2$ on morphology evolution during GaN metalorganic chemical vapor deposition," J. Han, et al., Appl. Phys. Lett. 71, Nov. 24, 1997, pp. 3114-3116.

"Optimization of Si/N Treatment Time of Sapphire Surface and Its Effect on the MOVPE GaN Overlayers," S. Haffouz, et al., 1999, pp. 677-681.

"Oscillator strengths for optical band-to-band processes in GaN epilayers," B. Gil, Physical Review B., vol. 54, No. 11, 1996, pp. 7678-7681.

"Dynamics of excitonic recombination and interactions in homoeptiaxial GaN," K. Korona, Physical Review B., vol. 65, 2002, pp. 235312-1-235312-8.

"Growth Morphology and the Equilibrium Shape: The Role of "Surfactants" in Ge/Si Island Foundation," D. Eaglesham, et al., Physical Review Letters, vol. 70 (1993), No. 7, pp. 996-968.

"High Resolution Photoluminiscence and Reflectance Spectra of Homoepitaxial GaN Layers," K. Komitzer, et al., (1999) pp. 5-9.

* cited by examiner (a) (b) (c) (d)

PROCESS FOR PRODUCING AN EPITAXIAL LAYER OF GALIUM NITRIDE

CROSS-REFERENCE TO RELATED APPLICATIONS

The present patent application is a continuation of application Ser. No. 11/519,702, filed Sep. 11, 2006, which claims priority to provisional application Ser. No. 60/751,387, filed Dec. 15, 2005, and which is a continuation-in-part of application Ser. No. 10/695,724, filed Oct. 28, 2003 now U.S. Pat. No. 7,118,929, which is a continuation-in-part of application Ser. No. 09/960,829, filed Sep. 21, 2001 now U.S. Pat. No. 6,802,902, which is a continuation of application Ser. No. 09/530,050, filed Jul. 7, 2000 now U.S. Pat. No. 6,325,850.

FIELD OF THE INVENTION

The invention relates to a process for growth of low dislocation density GaN on a substrate, and more particularly, to a process for epitaxial growth where the lateral and vertical growth rates of the material are controlled only by growth conditions. It also relates to a nitride semiconductor wafer having a GaN crystal formed by such a method and a nitride semiconductor device produced there from.

DESCRIPTION OF THE RELATED ART

GaN-based compound semiconductors, such as gallium nitride (GaN), the ternary alloys, indium gallium nitride (InGaN) and gallium aluminium nitride (GaAlN) and even the quaternary (AlGaInN) are direct band gap semiconductors. Their band gaps cover wavelengths extending from visible to UV. Henceforth, nitride alloy semiconductors are recognized as having great potential for short wave length emission. GaN is used in the manufacture of light emitting diodes (LEDs), blue-violet laser diodes (LDs) and UV detectors. The next generation of high density disc systems (blu-ray DVD and HD-DVD) will require GaN blue-violet LD. In addition to optoelectronics, due to its intrinsic properties (wide gap, high thermal and chemical stability, high electron saturation velocity), GaN will be used as well in the fabrication of high-temperature electronics devices.

Unfortunately, the development of nitride materials has been hampered by problems in the processing technology of such materials. One of the most important problems in the development of III-N devices is the lack of gallium nitride bulk substrates of acceptable usable area or of lattice-matched substrates for growth of low-defect density III-N layers. GaN is not found in nature; it cannot be melted and pulled from a boule like silicon, gallium arsenide, or sapphire, because at usual pressures its theoretical melting temperature exceeds its dissociation temperature. Substantial difficulties have been shown when attempting to obtain large-area crystals of any Group III-nitride that could provide suitable substrates for device fabrication. GaN bulk crystals can be grown by high pressure high temperature melt growth in liquid Ga. This technology has been developed previously, but the size of the substrate (~1 cm$^2$) and the volume of the potential mass production do not reach by far the industrial needs. Nevertheless low defect densities ~$10^2$ to $10^5$ cm$^{-2}$ have been achieved using this method. (I. Grzegory and S. Porowski, Thin Solid Films, 367, 281 (2000))

The techniques currently used for the fabrication of relatively high quality GaN and related layers involve the heteroepitaxial deposition of a GaN device layer onto a suitable but non-ideal substrate. Currently such substrates include (but are not limited to) sapphire, silicon, GaAs or silicon carbide. All heteroepitaxial substrates present challenges to the high-quality deposition of GaN, in the form of lattice and thermal mismatch. Lattice mismatch is caused by the difference in interatomic spacing of atoms in dissimilar crystals. Thermal mismatch is caused by differences in the thermal expansion coefficient between dissimilar materials.

Since the lattice constant of a sapphire substrate differs from that of GaN, a continuous GaN single crystalline film cannot be grown directly on the sapphire substrate. Therefore, a process wherein the strain of the lattice is relieved in a buffer layer of AlN or GaN grown on the sapphire substrate at a low temperature, and then GaN is grown thereon, has been proposed, and is currently achieved routinely. The use of a nitride layer grown at a low temperature as a buffer layer has enabled the single-crystalline epitaxial growth of GaN. However, even this method cannot compensate the lattice-mismatch between the substrate and the crystal, and the GaN film has still numerous defects.

Sapphire and SiC have become the standard substrates for III-N growth, despite significant lattice mismatches. Such large mismatches lead to the formation of very high densities of threading dislocations (TD) (~$10^9$ cm$^{-2}$) and eventually cracks. Thermal mismatch should also be considered. Typically, after the GaN is grown, as the sample cools to room temperature, the difference in thermal expansion (contraction) rates gives rise to high levels of stress at the interface between the two materials. Sapphire has a higher coefficient of thermal expansion than does GaN. As the sapphire substrate and GaN layer cool down, the mismatch at the interface puts the GaN under compression and the sapphire under tension. Thus, the amount of stress is directly related to the thickness of the deposited GaN, such that the thicker the film, the greater the stress. Above a film thickness of about 10 microns, the stress levels exceed the fracture limits of the GaN, and cracking of the film may result. Cracks in this layer are even less desirable than high dislocation densities since they may propagate during the processing of device structure. All the technological development of the epitaxy of GaN or sapphire or SiC aims to reduce the TD density and avoid crack formation.

The existence of extended defects (threading dislocations, stacking faults, and antiphase boundaries) leads to significantly deteriorated performances and results in a shortened operating lifetime of devices. More specifically, the dislocations behave as nonradiative centres, thus reducing the light-emitting efficiency of light-emitting diodes and laser diodes made from these materials. These dislocations also increase the dark current. Although threading dislocations have not prevented the development of high-brightness light-emitting diodes, the dislocations cause excessive reverse-bias leakage currents in p-n junction devices such as high-electron-mobility transistors, field-effect transistors and other electronic devices. Further, the dislocations can act as strong scattering centres for carriers, thus reducing the mobility of electrons and holes, limiting the performance of many semiconductor devices.

Numerous methods to reduce the TD and other extended defect density have been proposed.

Historically, Hydride Vapor Phase Epitaxy (HVPE) was the first method to produce epitaxial layers in the early 1970s. Because HVPE was unable to produce p-type GaN, it was largely abandoned in the early 1980s. Nowadays, the renewed interest in this method lies in its ability to grow GaN at high growth rates and thereby allow the fabrication of pseudo-substrates or free standing GaN. An analysis of the reduction mechanisms in GaN proposed by Mathis et al, J. Cryst.

Growth, 2001, predicts a decrease of the TD as a function of the thickness h as $h^{-2/3}$. This means that very thick layers (~300 μm) are required to reduce the TDs below $10^7$ cm$^{-2}$. In other words, by growing thicker layers more interactions between dislocations can take place. Indeed interactions are more efficient close to the interface where more mixed dislocations are present. As the layer becomes thicker, this leaves primarily edge dislocations with larger separation, therefore interactions become less and less likely and a further decrease of the density of TDs becomes difficult. Free-standing GaN with TDs densities of $3 \times 10^6$ cm$^{-2}$ were obtained following this process.

Other HVPE technologies have been developed to enhance the rather inefficient TD annihilation process like tuning growth conditions at the early stage of the growth to favour annihilation of TD through formation of dislocation loops, Hsu et al, U.S. Pat. No. 6,699,760. (rough surface).

Another alternative to get low defect stress relieved HVPE GaN on a sapphire substrate is described in U.S. Pat. No. 6,673,149. Such a technology involves the deposition of a defect rich layer (to release the stress) and another layer which smoothes out the growing surface and provide high quality layer. Such a process relies on two growing conditions like high-low growth rate.

Techniques for reducing the density of crystalline defects using Epitaxial Lateral Overgrowth (ELO) are widely documented, see for instance Phys. Stat. Sol., 2001, (b) 227, p 1-43. ELO involves at least two growth steps. ELO takes advantage of the faster growth of GaN in one given crystallographic direction to produce lower dislocation densities (less than approximately $10^7$ cm$^{-2}$). Nam et al. (Appl. Phys. Lett., 1997, 71(18), 2638-2640) describe the production of III-V semiconductor materials using ELO. This ELO method requires an initial growth of a GaN layer on a substrate, removal from the growth reactor, ex-situ processing, deposition of dielectric masks, and re-insertion into the growth reactor. Various etching and other processing steps are included.

In the standard ELO technology, growth process is tailored to promote lateral growth where TDs are not propagating. However, TDs dislocations are still propagating above the opening in the mask and devices like LD should be made on stripe above the masked area.

In the two-step ELO these drawbacks are to some extend avoided. Actually, in the first step, the growth conditions of GaN are adjusted to produce triangular stripes with {11-22} lateral facets. The growth rate Gc of the top (0001) facet is higher than the growth rate Gs of the inclined {1122} lateral facets. The ratio Gc/Gs is typically 3. The first step is pursued until the top facet completely vanishes. Then, in a second step, the lateral growth is favoured $G_S > G_C$ until complete coalescence and smoothing of the surface. Increasing the lateral growth rate can be achieved either by increasing the temperature, or introducing Mg in the vapour phase, or decreasing the pressure. The dislocations above the window first propagate vertically, (as in the standard-ELO), but afterwards bend by 90° to adopt a direction along the (0001) basal plane. The bending of most of the dislocations results in a drastic reduction of their density in the upper part of the film, i.e. for a thickness greater than the height of the pyramids obtained at the end of the first growth step. After bending, most of the dislocations have a line parallel to [I-210] which extends to the coalescence boundary with the overgrown GaN coming from the adjacent stripe. The boundary is therefore an area of defect accumulation. Several types of behaviours of the dislocations in the boundary have been observed:

bending down to the void resulting in their termination therein, bending up in the boundary and threading up to the surface.

a half loop is formed between two dislocations having the same Burger vector but coming from adjacent overgrowth. However, TDs that did not bent downwards or create a half loop, merge on the surface.

TDs bending can be explained qualitatively, from a simple free energy minimization viewpoint:

the Burgers vector of the TDs is not normal to the surface; this causes a straight dislocation line to feel forces tending to orient it at a certain angle to the normal. These forces acting on such a line are the sum of two terms, one acts to rotate the line so that it is normal to the surface, while the second term acts to align the dislocation with the Burgers vector. As the line energy of a dislocation depends also of its character, the energy of a screw being the lowest, bending at 90° of a edge eventually produce a screw dislocation, or introduce a screw component thus lowering the enthalpy of the system.

This behaviour of TD in the 2S-ELO technology has been recently quantified using the anisotropic elasticity theory to calculate dislocations energies in GaN as a function of their line direction, S. Gradečak et al, Appl. Phys. Lett., 85, 4648 (2004).

Two-step ELO, also called FACELO (Jpn. J. Appl. Phys., 2001, 40, L309) or FIELO (U.S. Pat. No. 6,348,096) and Cantilever Epitaxy (CE) as described in U.S. Pat. No. 6,599,362 are other efficient attempts of reducing the TDs density. Actually these methods involve the same basic mechanisms than in ELO.

ELO technologies have also been implemented in HVPE, but due to the high growth rate, wide pitch of the ELO openings in masks are required and new dislocations are often generated. HVPE is currently widely used to grow thick GaN layers to be eventually removed from the substrate.

Mask less technologies have also been implemented. Most of them require grooving trenches in either a GaN layer or in the substrate to induce TD density reduction characteristic of the ELO process. Alternatively, textured GaN surface can also be obtained by etching as described in US 2003/0085411, U.S. Pat. No. 6,500,747 and US 2003/0207125.

The inventors have discovered that the islands or features may be obtained without necessarily the creation of an intrinsic mask, but through the growth conditions. In the present invention, a coherent array of islands preferably does not result from any kind of masking, nor roughening the GaN surface, nor etching, nor grooving but by properly tuning the growth conditions. Furthermore, this method is applicable not only in MOVPE, but also in HVPE, CSVT and LPE.

The present invention is based upon the Universal Lateral Overgrowth (ULO) process of reduction of TDs, and aims to produce low dislocation density free standing GaN using a new TD reduction mechanism. Threading dislocation density is estimated either on the basis of Atomic Force Microscopy (AFM), which allows to count edge and mixed dislocations, or by Cathodoluminescence (CL). In CL each merging dislocation gives a dark spot.

ULO does not require any external action to occur since it is controlled only by a proper adjustment of the growth conditions, and it can be applied several times during a run. It has the further advantage of avoiding any ex-situ processing and re-insertion into the growth reactor. The present invention thereby furnishes a process which implementation is easier, and easily transposed industrially.

SUMMARY OF THE INVENTION

The present invention concerns a method of manufacturing a low defect density GaN material comprising at least two step of growing epitaxial layers of GaN with differences in growing conditions,
   a. a first step of growing an epitaxial layer GaN on a epitaxially competent layer under first growing conditions selected to induce island features formation, followed by
   b. a second step of growing an epitaxial layer of GaN under second growing conditions selected to enhance lateral growth until coalescence.

An epitaxially competent layer is a layer allowing epitaxial growth of GaN crystals. Indeed, steps a) and b) can be reproduced sequentially several times in subsequent growing loops. Therefore, for the first loop, the epitaxially competent layer may be a substrate material, or any GaN layer. For the subsequent loops, the epitaxially competent layer is a GaN layer obtained by step b) of the preceding loop.

In such event, full coalescence is preferably obtained for the intermediary step b) where regrowth of islands is performed after. However, for the last step b), full coalescence is not an obligation since GaN crystals are generally treated after growth, like with polishing the upper layer to obtain a flat, smooth, "mirror like", surface.

Inducing island features during the first growing conditions in the first step a) equal creating pits on the surface of the GaN layer obtained under said first growing conditions.

Coalescence obtained with the second growing conditions in step b) equal to at least partially fill pits formed between the islands.

According to the prevent invention, growing conditions comprises essentially the following parameters:
   Composition of the vapour phase,
   Flow rate of each vapour reactant
   Pressure of the growth chamber
   Temperature
   Growth rate.

The differences in growing conditions are preferably selected among the group consisting of differences in temperature and differences in composition of the vapour phase and combinations thereof.

When the difference in growing conditions is on the temperature, the temperature of the said second growing conditions is higher than the temperature of the said first growing conditions.

When the difference in growing conditions is on the composition of the vapour phase, it can be obtain with addition of gas such as oxygen, or the addition of elements such as Mg, Bi, Sb or Si.

Preferably, oxygen pressure in the vapour phase of the first growing conditions is above oxygen pressure in the vapour phase of the second growing conditions. More preferably oxygen is added to the vapour phase of the first growing conditions to induce island features formation and oxygen is excluded from the second growing conditions to induce enhanced lateral growth.

Preferred elements added to the vapour phase are selected among Mg and/or Sb, added to the vapour phase of the second growing conditions.

In the method according to the invention, the epitaxially competent layer in first step a) is a substrate material generally comprising a base layer and an upper crystalline layer compatible with the growth of the nitride crystal.

The method of the invention also comprises a further step of wafering of the low defect density GaN material.

A low defect density GaN material obtained by the method of the invention is also part of the invention.

BRIEF DESCRIPTION OF THE FIGURES

FIG. 5 shows the advantageous effect of the magnesium dopant on the GaN growth mode in that it allows coalescence of the features to be obtained much more rapidly, resulting in the formation of a strain-free continuous gallium nitride layer in epitaxial relationship.

DETAILED DESCRIPTION OF THE INVENTION

Figure 1:
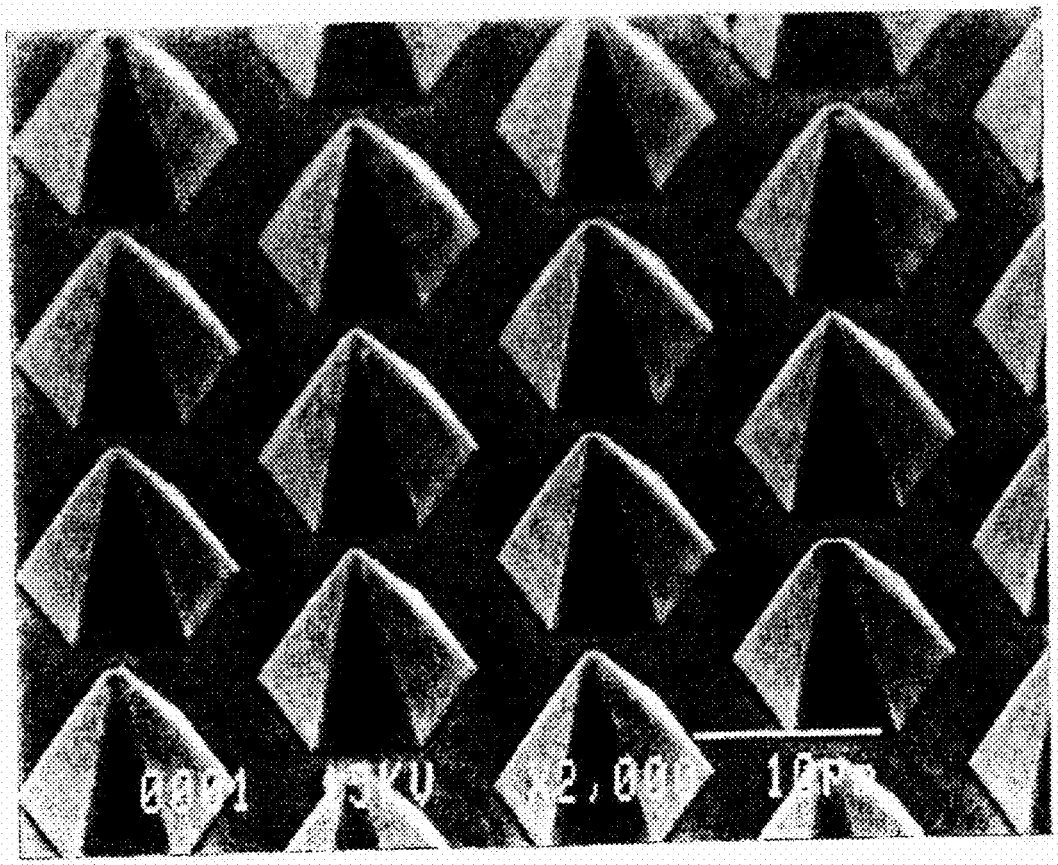
FIG. 1 is a photograph showing regular pyramidal features formed during the localized epitaxy using undoped gallium nitride, when the apertures in the dielectric are discrete apertures.

Advanced optoelectronic devices require low threading dislocation densities<10$^6$ cm$^{-2}$. The most widely used surface is the (0001)Ga face, which should have a surface epiready for the direct growth of device structures thereon. Besides, the crystallographic orientation should not deviate from the (0001) orientation otherwise gradient gradients of In incorporation may occur during of LD or LED structure on vicinal planes.

An object of the present invention is a method of manufacturing low defect density GaN involving the following steps:
 a. a first step of growing an epitaxial layer GaN on an epitaxially competent layer under first growing conditions selected to induce island features formation, followed by
 b. a second step of growing an epitaxial layer of GaN under second growing conditions selected to enhance lateral growth until coalescence.

Step a) is preferentially achieved without using any kind of mask, nor roughening, nor etching, nor grooving the surface of the epitaxially competent layer, and only by changing the growing conditions, such as operating pressure in the growth chamber, the partial pressure, the temperature, the V/III ratio and/or by adding surfactant or antisurfactant chemical species or elements in the vapour phase.

The first growing conditions of this first GaN layer are tuned to produce a non-flat surface, more particularly a coherent array of islands with different size thereby generating a ULO process. 90° bending of TD takes place inside these islands.

In a further step b) of the process, the growth conditions are changed to enhance growth in the lateral direction from the random array of coherent islands to get a smooth surface.

These two growth steps can be eventually repeated thereby inducing multiple bending of the TDs and creation of dislocation loops.

Thus another object of the invention is a method as described above, wherein the steps a) and b) of subsequent growth of GaN to produce island features and smooth surface is repeated several times.

The low defect density GaN material obtained by the method according to the invention is a single crystal. Said single crystal has generally a thickness of more than 1 μm. Crystals with low defect density can be obtained with a thickness ranging from 100 μm to 10 cm, advantageously ranging from 500 μm to 3 mm.

Free-standing GaN of the present invention exhibit TD densities $<10^6$ cm$^{-2}$.

In the method according to the invention, the first step consists in forming GaN islands on the surface of a substrate material. Said substrate generally comprises a base layer and an upper crystalline layer compatible with the growth of the nitride crystal.

The upper crystalline layer is advantageously chosen among the group consisting of sapphire, spinel, GaN, AlN, GaAs, Si, SiC (6H-, 4H-, 3C-), LiAiO2, LiGaO2, ZrB2, HfB2 and mixtures thereof, preferably an AlN or GaN crystalline material.

The base layer is generally a sapphire layer.

Even though a large strain results from the difference in thermal expansion coefficients between the gallium nitride layer and the sapphire substrate, the sapphire substrate can be removed using methods well know by the person skilled in the art like, but not limited to laser lift off, H$^+$ implantation, strained induced separation.

In the method according to the invention, the substrate can also comprise at least one sacrificial layer between the base layer and the upper layer. Such sacrificial layer(s) allow an easier removal of the grown GaN material.

Growth of a GaN upper layer on starting substrate may occur through MOPVE or by any other ELO related technology well known by the skilled person in the art. Among these methods, mentioned may be made of HVPE, CSVT, or LPE.

Subsequent growth of GaN in steps a) and b) may also occur through one method chosen in the group consisting of MOVPE, HVPE, CSVT, or LPE. Advantageously it is carried out by a HVPE technique.

In a first preferred embodiment, a GaN/sapphire template is achieved by MOVPE methods, well known from the skilled person in the art. Then, the subsequent deposition of GaN layers according to the invention is carried out by a HVPE technique.

The HVPE process is a chemical vapour deposition method carried out in a hot wall reactor. The gallium precursor, gallium monochloride GaCl employed in the deposition process is formed within the reactor, upstream from the GaN/sapphire templates, by the reaction of HCl with liquid Ga, at high temperature. GaCl is then transported by a carrier gas to the substrate downstream in the reactor where it reacts with NH$_3$ at a temperature between 800-1200° C. to form GaN, via the reaction:

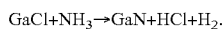

$$GaCl+NH_3 \rightarrow GaN+HCl+H_2.$$

The V/III ratio is defined as the ratio of the partial pressure of the gaseous species containing N (as NH3) to the ratio of the gaseous species containing Ga (as GaCl or HCl since GaCl is formed via HCl). In the method according to the present invention, HVPE of GaN is carried out with a low V/III ratio less than preferably less or equal to 15.

Due to the relatively low vapour pressure of GaCl, the vapour tends to condense on unheated surfaces, thereby requiring the in situ synthesis GaCl in a reactor operating under hot wall conditions. This avoids an otherwise complicated gas delivery and gas inlet heating system required for external gaseous precursor and storage.

In HVPE growth of GaN, Ga metal can be readily obtained with a purity of more than 99.9999% and with a properly designed gas delivery system, HCl gas with purity more than 99.999% purity can be provided using an appropriate in line getter.

To obtain desired high throughput with acceptable overall process duration, growth rates in excess of 50 μm/hr are advantageously employed. Growth is beneficially carried out at temperatures between about 900 and about 1150° C.

When the difference in growing conditions is on the temperature, the temperature of the said second growing conditions is higher than the temperature of the said first growing conditions.

In the method according to the present invention, the temperature of the first growing conditions is below 1060° C., preferably below 1000° C., more preferably comprised between about 500° C. and about 1000° C.

In a first embodiment, the temperature of the first growing conditions is comprised between about 950° C. and about 1060° C.

In another embodiment, the temperature of the first growing conditions is below 950° C.

The temperature of the second growing conditions is above the temperature of the first growing conditions. It will be therefore established by the person skilled in the art in relation of the above temperatures for the first growing conditions. However, the skilled artisan may also decide the preferred temperature for the second growing conditions and then establish the temperature of the first growing conditions for proper island formation.

In the method according to the invention, the temperature of the second growing conditions is preferably above 1000° C.

In one embodiment, the temperature of the second growing conditions is comprised between about 1015° C. and about 1020° C. In another embodiment, the temperature of the second growing conditions is above 1060° C., about 1080° C.

In a first particular embodiment, the temperature of the first growing conditions is about 1060° C. and the temperature of the second growing conditions is about 1080° C. In a second particular embodiment, the temperature of the first growing conditions is comprised between 450° C. and 600° C. and the temperature of the second growing conditions is about 1080° C.

In a preferred embodiment of the method of the invention, the temperature of the first growing conditions is comprised between about 900° C. and about 950° C. and the temperature of the second growing conditions is comprised between about 1015° C. and 1020° C.

When the difference in growing conditions is on the composition of the vapour phase, it can be obtain with addition of surfactant or antisurfactant chemical species, such as oxygen, or the addition of elements such as Mg, Bi, Sb, Si or Ge.

Preferably, oxygen pressure in the vapour phase of the first growing conditions is above oxygen pressure in the vapour phase of the second growing conditions. More preferably oxygen is added to the vapour phase of the first growing conditions to induce island features formation and oxygen is excluded from the second growing conditions to induce enhanced lateral growth.

Thus, in a preferred method according to the present invention:
  step a) is achieve at a temperature of about 1020° C. adding $O_2$ in the vapour phase to induce island features, and
  step a) is achieved at 1020° C. without $O_2$ to obtain coalescence of the island features.

Additionally, "impurities" (doping species, surfactants, transition metal) can be added during growth of the thick GaN layer. Mention may be made of Mg, Bi, Sb, Si, O or Ge.

By way of example, Mg and/or Sb are added in the vapour phase during step b) of the above method. Alternatively, silane or chlorosilane may be added in the vapour phase, particularly when steps a) and b) are achieved by HVPE. When Mg is added in the vapour phase, this can be achieved either in the form of MgCl2 obtained by reaction of HCl over a solid magnesium source or in the form of biscyclopentadienyl magnesium.

In a most preferred embodiment of the invention, the first growing conditions comprise a temperature of between 900° C. and 950° C. and an oxygen pressure pose in the vapour phase such that the ratio $P_{Ox}/P_{GaCl}$ is greater than 0.0005 and the second growing conditions comprise a temperature of between about 1000° C. and 1050° C. without oxygen in the vapour phase.

Figure 14:
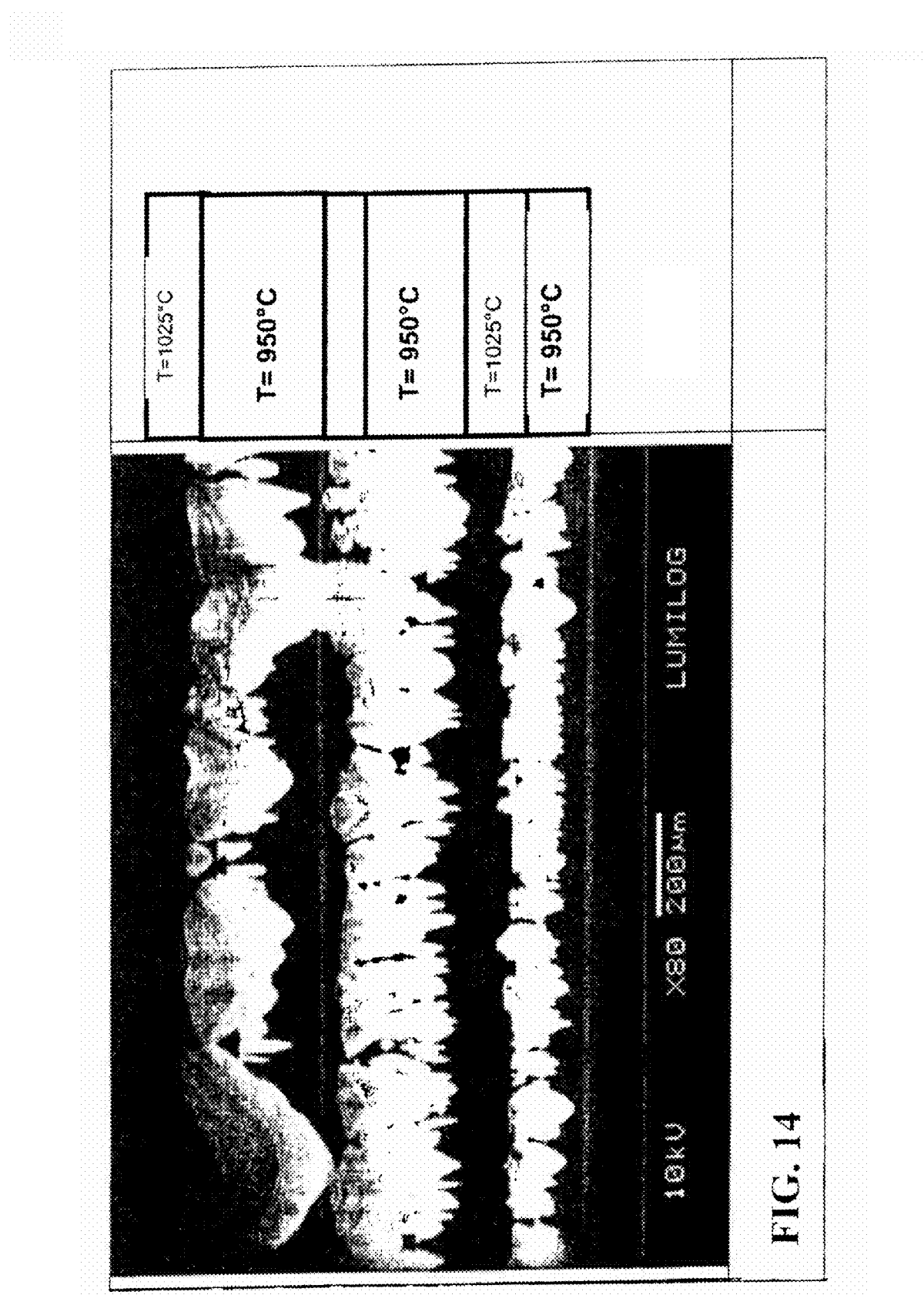
FIG. 14 shows a panchromatic cathodoluminescence of a thick HVPE layer grown following the present invention, and growth temperatures sequence.

Panchromatic cross sectional cathodoluminescence (CL) examination of this first stage indeed exhibits an uneven dark layer, which corresponds to the island features formation on top of the MOVPE template (FIG. 14). It is well established that inside pyramids in the two-step ELO, the near band gap CL intensity drops. Conversely, in this first layer, growth further proceeds from faceted islands. In this low temperature regime, the lateral growth rate remains low. More specifically, growth proceeds from faceted islands, whereas the (0001) face does not appear. Then, after islands are formed, growth further proceeds from lateral facets. CL intensity become much higher and appears as white because of the enhanced Oxygen incorporation on the lateral facets.

After the low temperature step, the growth temperature is increased. In these new growth conditions, the lateral growth rate is enhanced and the layer becomes flat. CL corresponding to this high temperature growth step appears as grey, because of the high quality of the GaN layer and the reduced incorporation of Oxygen.

The full process may be understood as follows:

When HVPE growth is carried out at low temperature, 3D island growth mode takes place. The basic mechanisms are similar to those occurring in SiN nano-masking, more specifically TD underwent a 90° bending when they met a lateral facet. In these growth conditions, which were defined as ULO, the 3D islanding remains as growth proceeds. It is well established by the person skilled in the art that the incorporation of doping impurities is facet dependant, and therefore the Oxygen incorporation is enhanced on lateral facets, as evidenced by SIMS (FIG. 14).

In the second HVPE step at high temperature, higher partial pressure of ammonia, growth occurs laterally until reappearance of (0001) facets.

Figure 16:
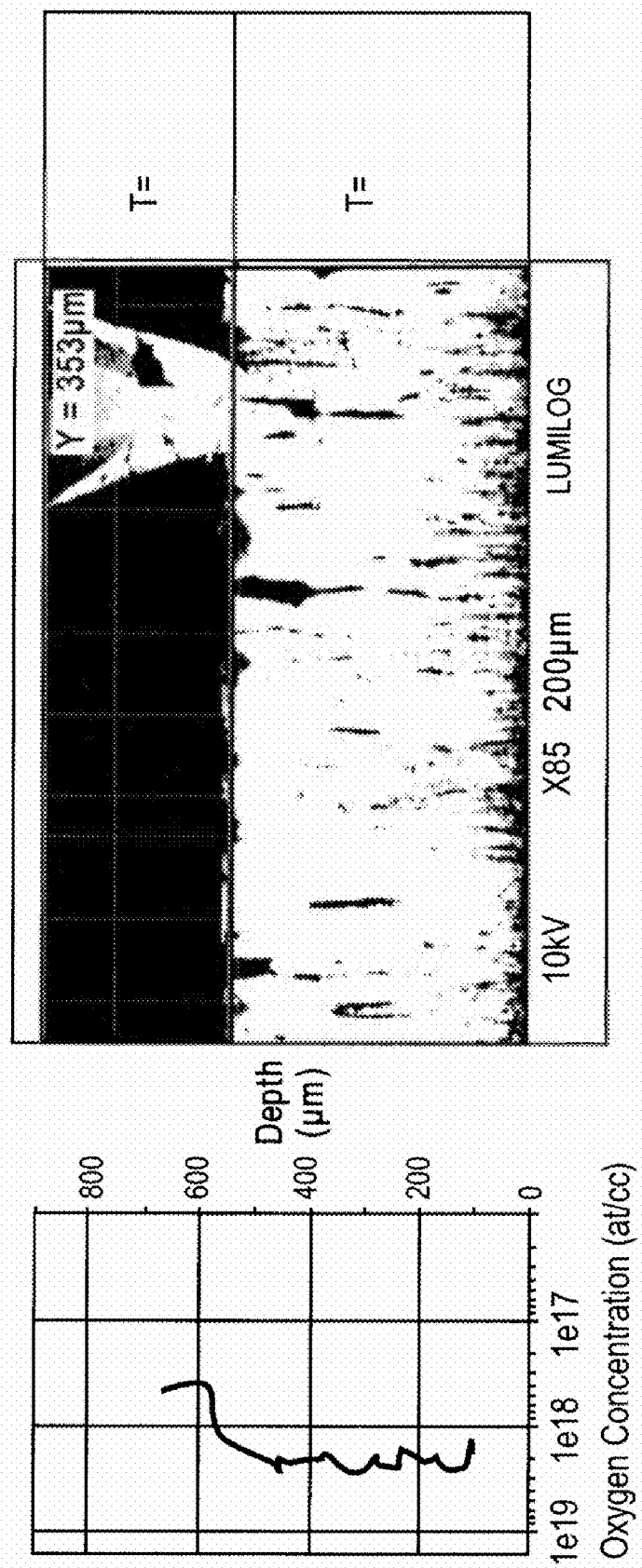
FIG. 16 shows cross sectional cathodoluminescence and O SIMS profile of GaN grown by HVPE on MOVPE GaN/Si/Sapphire.

TDs that have bent at 90° propagate parallel to the substrate surface until they create a coalescence boundary with a neighbouring growing facets. In this coalescence boundary, they can recombine with another TD, or bend once again either downwards or upwards. After recovering a flat surface, growth becomes 2D, Oxygen incorporation is more than one order of magnitude lower than on lateral facets (cross sectional SIMS data).

μ-PL analysis provides further information for an in-depth understanding of the growth process (FIG. 16). In the coolest part, the near band gap PL peak is rather broad whereas it is extremely sharp in GaN grown at higher temperature. In addition, excitonic peaks do appear in the high temperature part, this is a proof of the high optical quality of this material. The uppermost part exhibits the sharpest μ-PL peaks with a FWHM<1 meV and their energetic position corresponds to fully relaxed GaN. The μ-PL of the starting GaN template corresponding to the present state of the art presents a FWHM of the excitonic peak ~2 meV To get useful thick enough free standing GaN for further processing, the HVPE should last for several hours. This means that the mechanism of reduction of the density of TD, i.e, ULO should take place not only at the beginning of the growth but might be eventually repeated.

In a second embodiment of the present invention, at the early stage of the HVPE growth on GaN/sapphire template, a surface consisting of a coherent array of uneven pyramids is formed. In the present invention, this takes place by growing GaN at a rather low temperature.

At this rather low temperature, GaN grows in the form of coherent island, randomly distributed with random size, thus involving a ULO process.

The substrates are introduced in a multiwafer HVPE reactor operating at low pressure, without any further technological step like cleaning or etching.

The invention provides an HVPE nitride growth reactor, which is particularly designed for growth of GaN thick epitaxial films. More specifically, this HVPE reactor allows holding 6×2" wafers on a rotating susceptor. The reactor is configured in a resistively heated furnace tube in the conventional manner, with the furnace being vertically oriented. The reactor provides two distinct parts, namely, one for the GaCl synthesis, and the growth chamber. With this configuration, GaCl is formed in situ upstream of the growth chamber, into which it is then delivered. In the growth chamber, a susceptor supports up to 6 GaN/sapphire templates on which the epitaxial layer is to be grown. GaCl is delivered to the growth chamber in the vicinity of the susceptor to achieve the growth process. NH3 is also delivered in the vicinity of the susceptor in such a way that premature mixing with GaCl is avoided.

For many applications a freestanding GaN layer is preferred to even high quality GaN epitaxial layers. Thus in a third preferred embodiment of the present invention, the method of manufacturing described above further include a step wherein the thick layer of GaN is separated from the initial substrate. For that purpose, the ELO quality MOVPE template is either inherently or intentionally engineered to exhibit a mechanical weakness, in a plane parallel to the growth surface, of sufficient magnitude to promote a mechanical failure along that plane, and to result in delaminating of the epitaxial gallium nitride layer due to thermal stress produced as the sapphire substrate and GaN layer are cooled after the growth. In another aspect of this invention, a sacrificial layer is inserted between the sapphire substrate and the thick HVPE layer. To enhance quality of the obtained free standing GaN, the method according to the present invention is ended by polishing the top and bottom surface of the free GaN obtained.

The invention also concerns the thick GaN layer obtained by a method according to the present invention. Preferably, said free standing GaN has a measured lifetime of time resolved photoluminescence (TPRL) of the PL peak corresponding to electron-hole plasma under high excitation 0.4 mJ/cm$^2$ at room temperature higher than 400 ps, and more preferably higher than 800 ps.

The cool-down fracture and delaminating mechanism is particularly advantageous in that it provides a process of stress release alternate to one of cracking through the thickness of the GaN layer, thereby enabling the formation of thick, crack-free, as well as free-standing, GaN layers. Because the GaN layer delaminating generally can be expected to occur near to the growth temperature, a GaN layer cracking mechanism is therefore suppressed.

The present invention will be illustrated referring to the following examples without limiting the scope of the invention.

Example 1

Deposition of an Undoped Gallium Nitride Layer

A suitable vertical reactor operating at atmospheric pressure is used for the Organometallic Vapor Phase Epitaxy. A thin gallium nitride layer 2 having a thickness of 2 μm is deposited, by or GaNometallic vapor phase epitaxy at 1080° C. on a (0001) sapphire substrate 1 having a thickness of 200 μm. The gallium source is trimethylgallium (TMGa) and the nitrogen source is ammonia. Such a method is described in many documents.

The experimental conditions are as follows:

The gaseous vehicle is a mixture of $H_2$ and $N_2$ in equal proportions (4 sl/min.). The ammonia is introduced via a separate line (2 sl/min.).

After the first gallium nitride epilayer has been grown, a thin layer of a silicon nitride film 3 is deposited as a mask for the subsequent selective growth of gallium nitride using $SiH_4$ and $NH_3$ at a rate of 50 sccm- and 2 slm, respectively.

The electron transmission microscope observations on cross sections show that the mask obtained forms an amorphous continuous layer having a thickness of approximately 2 nm. Since the stoichiometry of this film was not measured, the term SiN will be used for the rest of this specification. Nevertheless, it seems that the stoichiometry corresponds to the $Si_3N_4$ term. Although extremely thin, this SiN layer proved to be a perfectly selective mask. The etching is then carried out, by photolithography and reactive ion etching, in order to expose hexagonal apertures 4 circumscribed by a 10 μm diameter circle. The distance between the centers of two adjacent apertures in the mask is 15 μm. The epitaxial regrowth on the exposed gallium nitride regions 5 in order to deposit gallium nitride is carried out on the specimens etched under conditions similar to those used for the standard gallium nitride growth, apart from the TMGa flow rate. This is fixed at a lower value (typically 16 μmol/min. for the experiments with undoped gallium nitride) so as to avoid high growth rates resulting from the very effective collection near the regions 5 of the gallium atoms encountering the surface of the mask. The localized epitaxy reveals a growth rate Vc of gallium nitride 6 in the [0001] direction virtually proportional to the space in between two apertures.

In addition, no nucleation on SiN is observed, even for large spacings. From this it may be concluded that the nucleation and the growth of GaN occurs selectively in the apertures 5. Consequently, the masked areas behave as concentrators, directing the atoms toward the apertures.

The growth rates are measured either in situ by laser reflectometry, or thereafter by scanning electron microscopy (SEM) on drop views or sections.

FIG. 1 is an SEM photograph showing the development of the pyramids.

Figure 2:
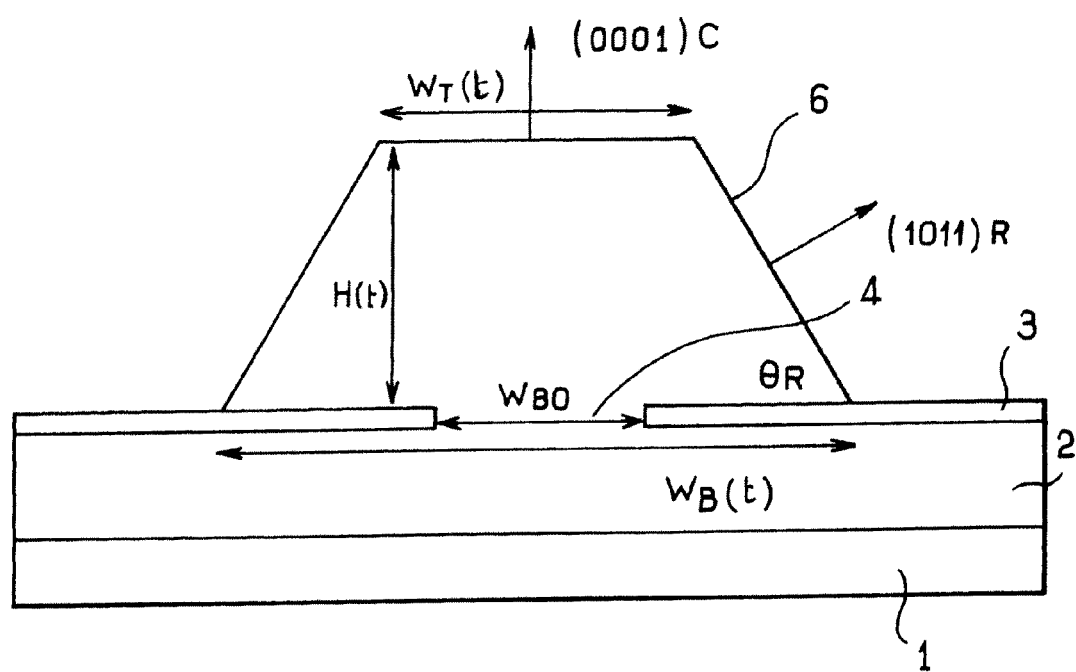
FIG. 2 is a sectional view perpendicular to the [11-20] direction of a localized gallium nitride truncated hexagonal pyramid.

FIG. 2 is a sectional view perpendicular to the [11-20] direction of a localized, truncated hexagonal gallium nitride pyramid. $W_T$, $W_B$ and H depend on the time t. $\Theta_R$ is the angle between (0001) and (1011) defining the planes. $W_{BO}$ is the width of the apertures in the SiN mask.

Figure 3:
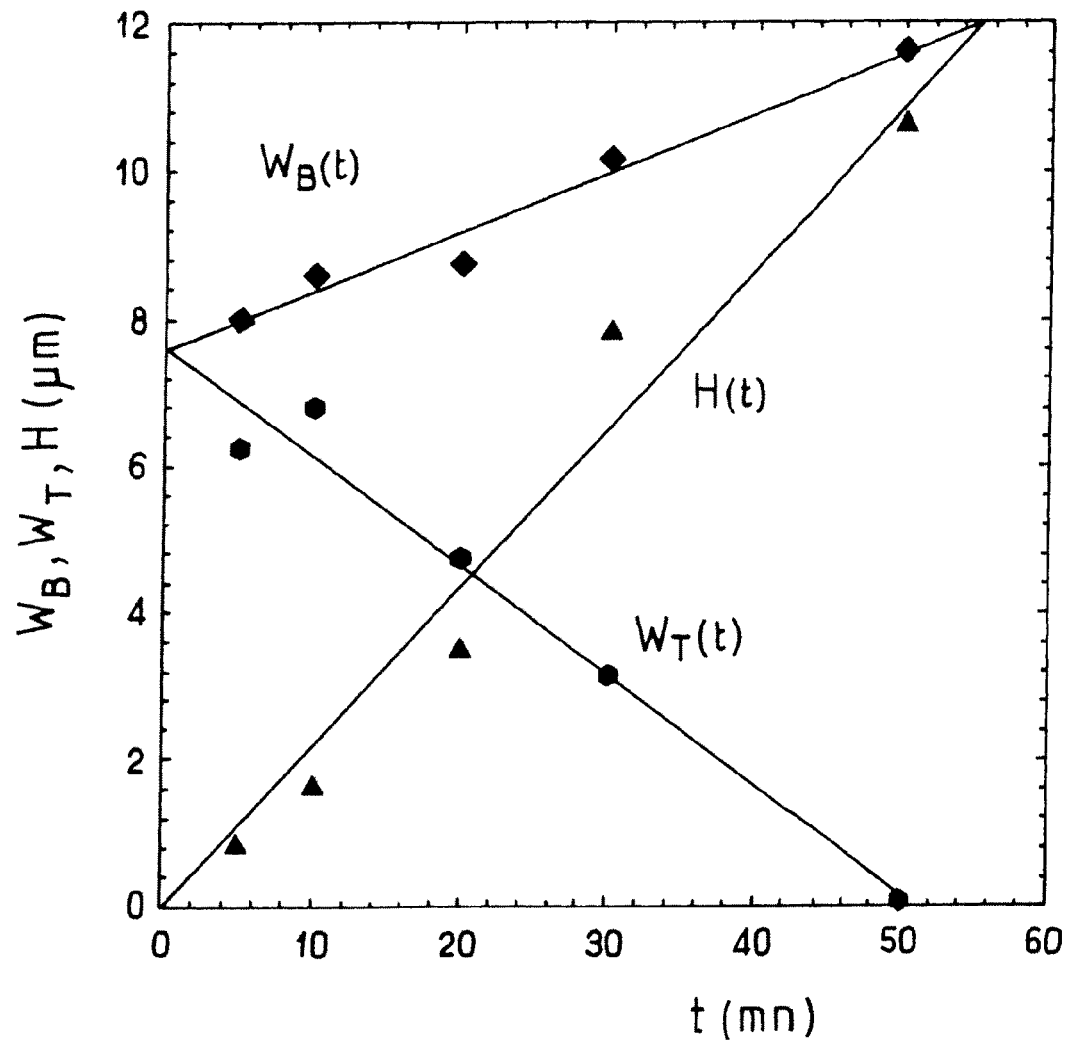
FIG. 3 shows the variation in $W_T$, $W_B$ and H values in μm as a function of the growth time in min. $W_T$, $W_B$ and H are defined in FIG. 2.

FIG. 3 shows the variation in the $W_T$, $W_B$ and H values in μm as a function of the growth time in min. Using linear regressions through the experimental points, the following results are obtained:

$V_R$=2.1 μm/h (lateral rate in the [1011] direction);

$V_c$=13 μm/h (rate in the [0001] direction);

$W_{BO}$=7.6 μm;

$\Theta_R$=62.1°

When $W_T$=0 at t. (the pyramid has a peak of zero width), the height H varies at a lower rate, given by the formula $V_R/\cos(\Theta_R)$.

It will be noted that $V_C$ is extremely high compared with the rate of 1 μm/h measured for standard epitaxy on a (0001) substrate using the same vapor phase composition. Consequently, the $V_R/V_C$ ratio is only approximately 0.15.

Example 2

Deposition in the Gaseous Phase of a Layer of Gallium Nitride to Which Magnesium has been Added The experiment of Example 1 is repeated apart from the fact that 2.8 μmol/min. of $(MeCp)_2$ Mg is introduced in the vapor phase. The conditions used are: growth time 30 min., growth temperature 1080° C., TMGa 16 μmol/min. and $N_2$, $H_2$ and $NH_3$ 2 sl/min. for each of them.

Figure 5:
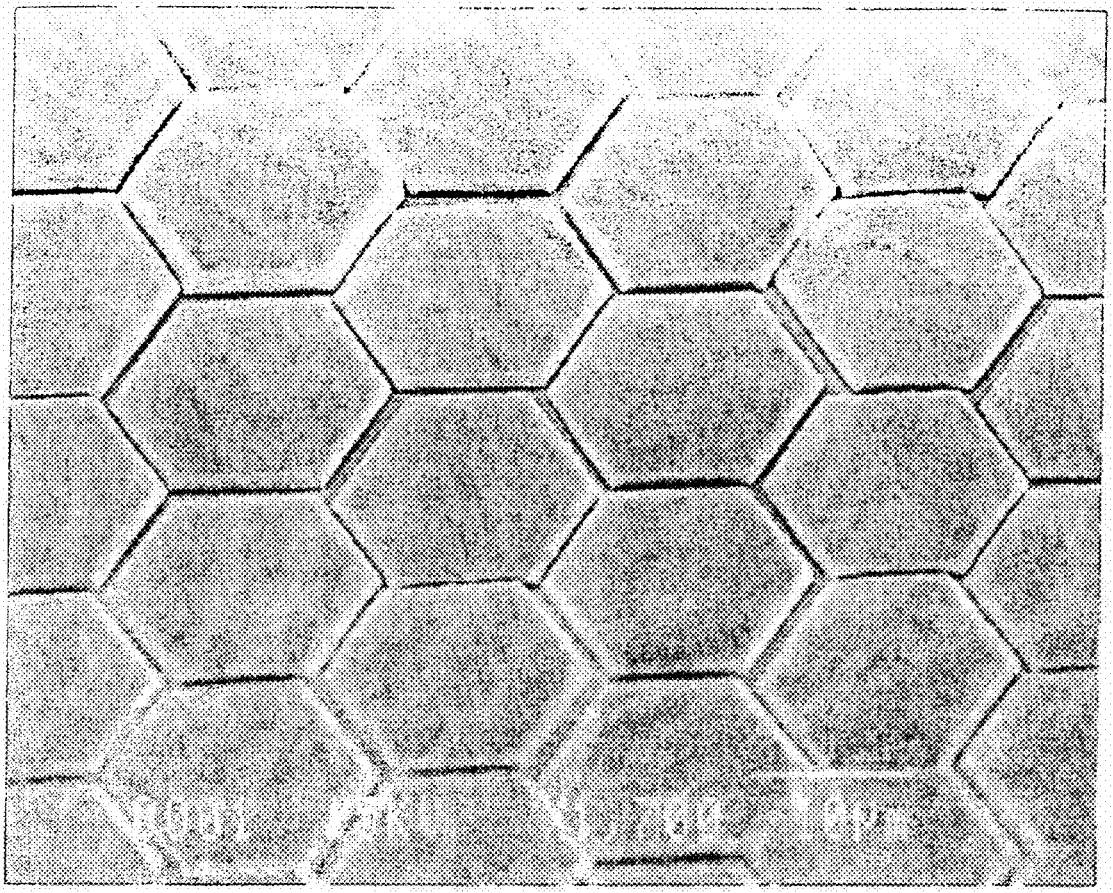
FIG. 5 is a photograph of the observed pyramids obtained by localized epitaxial regrowth with magnesium-doped GaN.

FIG. 5 shows that the presence of magnesium increases the $V_R/V_C$ ratio well above the cos(OR) threshold and consequently the (0001) upper facet broaden. The selectivity of the growth is not affected by the presence of $(MeCp)_2$ Mg, but the growth anisotropy is advantageously modified.

Example 3

Influence of the Mg/Ga Molar Ratio

Figure 4:
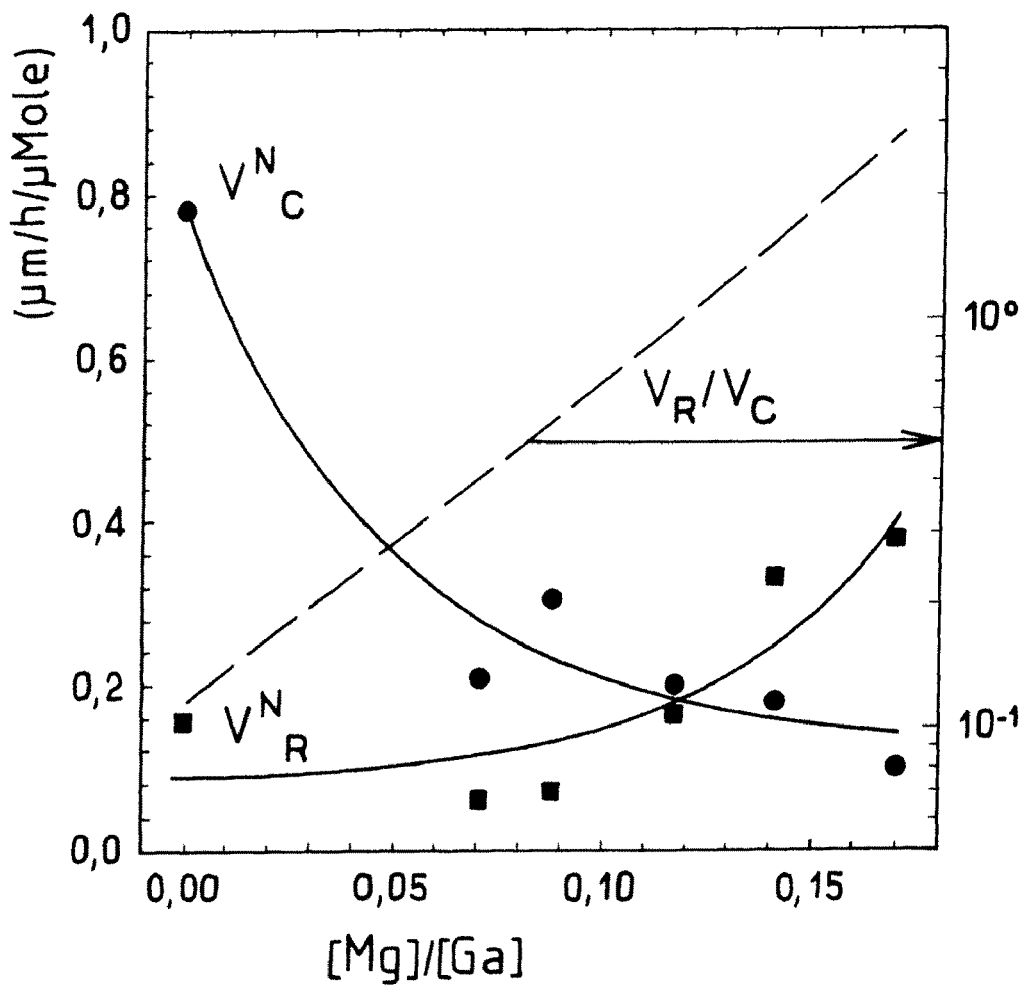
FIG. 4 shows the variation in the growth rates normalized to the molar flux of TMGA in the [0001] and <10-11> directions as a function of the Mg/Ga molar ratio in the vapor phase.

FIG. 4 shows the variation in the growth rates normalized to the TMGA molar flux in the [0001] and [1011] directions as a function of the Mg/Ga molar ratio in the vapor phase.

In practice, it was chosen to keep a constant flux of $(MeCp)_2$ Mg and to vary the amount of TMGA. This makes it possible to ensure that the available Mg concentration on the surface of the growth islands is identical for all the specimens.

Because the growth is controlled linearly by the amount of gallium supplied, the growth rates are normalized in order to compare them.

$V^N_C$ rapidly decreases from 0.8 to 0.1 µm/h/µmol, while $V^N_R$ increases from 0.16 to 0.4 µm/h/µmol when the Mg/Ga molar ratio varies from 0 to 0.17. The dotted line is the curve of the $V_R/V_C$ ratio obtained by extrapolation. The y-axis on the right is $V_R/V_C$.

This curve shows that the incorporation of Mg allows the pyramidal structure to be easily controlled by modifying the growth anisotropy. This suggests that Mg acts as a surfactant, favouring the adsorption of gallium on the {1011} faces but, conversely, preventing it on the (0001) faces.

Example 4

Two-Step Deposition of a Gallium Nitride Layer

Firstly, the process according to the invention is carried out using epitaxial regrowth under operating conditions comparable to those of Example 1.

A SiN mask is deposited on a GaN layer deposited beforehand in an epitaxial manner in a suitable reactor on a crystallization substrate such as sapphire. Linear apertures 5 µm in width and spaced apart by 5 µm are then made in the mask in order to expose the regions of the subjacent layer. The linear apertures are advantageously oriented in the GaN [1010] direction, although the variant of the process described in this example can be optionally carried out for other orientations of the linear apertures, especially in the GaN [1120] direction.

The epitaxial regrowth is carried out on the exposed regions with unintentionally doped GaN under operating conditions such that the growth rate in the [0001] direction of the GaN features sufficiently exceeds the growth rate in the direction normal to the inclined flanks of said features. Under such conditions, the anisotropy of the growth results in the disappearance of the (0001) facet. The first implementation step of the process is completed when the (0001) facet of the GaN feature has disappeared. At the end of the first step, the GaN features are in the form of a stripe, the cross section of which is triangular. However, it is possible to continue the first step until coalescence of the GaN features, in order to completely recover the mask. In this case, the cross section of the coalesced GaN features is a zigzag line.

The second step consists of the epitaxial regrowth with doped GaN, especially with magnesium-doped GaN according to Example 2 or 3, on the GaN features created in the first step. Due to the effect of introducing the dopant, the growth anisotropy is conducive to planarization of the GaN features. The facet C reappears at the top of each of the GaN features obtained in the first step. During this second step, the doped GaN features develop with an expansion of the facet C and, on the contrary, a reduction in the area of the flanks. The second step of the process according to the example is completed when the flanks have disappeared, the upper surface of the deposit formed by the coalesced doped-GaN features then being plane.

The implementation of the two-step process, according to the invention as described above, results on the one hand, in the formation of a plane GaN layer, which can therefore serve as GaN substrate for the subsequent deposition, by epitaxial regrowth, of a device structure, especially a diode laser structure, but results, on the other hand, in a highly advantageous improvement in the crystal quality of said substrate. This is because the lines of crystal defects in the subjacent GaN layer propagate via the aperture made in the mask, vertically into the undoped GaN feature created in the first step. However, it seems that these lines of defects become curved during the second step devoted to the deposition of a doped-GaN features. This results in lines of defects which propagate in directions parallel to the surface of the masked GaN layer.

Because of the modification of the direction of propagation of the defects, the upper surface formed by the coalescence of the GaN features is virtually free of emerging defects in regions compatible with the size of electronic devices, such as GaN diode lasers.

Example 5

Spontaneous Formation of Gallium Nitride Islands on a Silicon Nitride Layer of the Order of an Atomic Monolayer This example illustrates a method making it possible to obtain spontaneous formation of gallium nitride islands on a substrate by a treatment consisting in covering the substrate with a silicon nitride film whose thickness is of the order of 1 angstrom. Advantageously, this method makes it possible to avoid having to use ex situ etching of the mask by expensive techniques such as photolithography and chemical etching.

A suitable epitaxial growth reactor is used for the metalorganic vapor phase epitaxy. Explicitly, a substrate, especially (0001) sapphire, is heated to a temperature of approximately 1050-1080° C. in order to be nitrided by exposure to a stream of $NH_3$ for approximately 10 minutes. After this nitriding step, a very thin film of silicon nitride is formed on the surface of the substrate, the film being obtained by reaction between $NH_3$ and silane $SiH_4$ at a temperature of 1080° C. for a time short enough to limit the thickness of the film to that of one atomic plane.

The operating conditions are the following:

The gaseous vehicle is a mixture of nitrogen and hydrogen in equal proportions (4 sl/min.). The ammonia is introduced with a flow rate of 2 sl/min. while the silane, in a form diluted to 50 ppm in hydrogen, is introduced with a flow rate of 50 scc/min. Under these conditions, the typical $NH_3$ and $SiH_4$ reaction time is of the order of 30 seconds.

The successive steps are monitored by laser reflectometry (LR) and transmission electron microscopy (TEM).

After the silicon nitride layer has been completely formed, a continuous gallium nitride layer having a thickness of 20 to 30 nm is deposited on the silicon nitride between 450 and 650° C.

Figure 6:
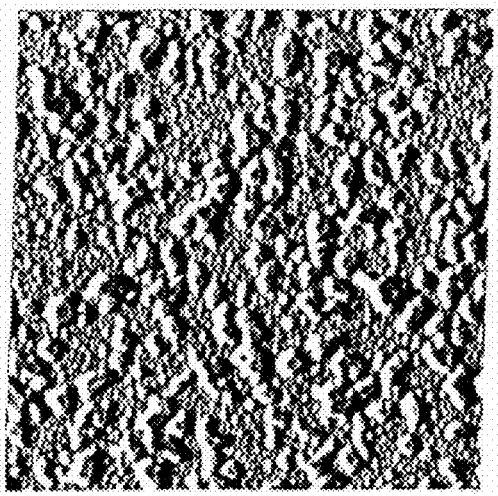
FIG. 6 shows AFM (5×5 μm$^2$) scans showing the layer morphology versus SiN treatment time. The GaN islands density is about a) $1\times10^9$ cm$^{-2}$ b) $5\times10^8$ cm$^{-2}$ c) $3\times10^8$ cm$^{-2}$ d) $1\times10^8$ cm$^{-2}$.
Figure 6:
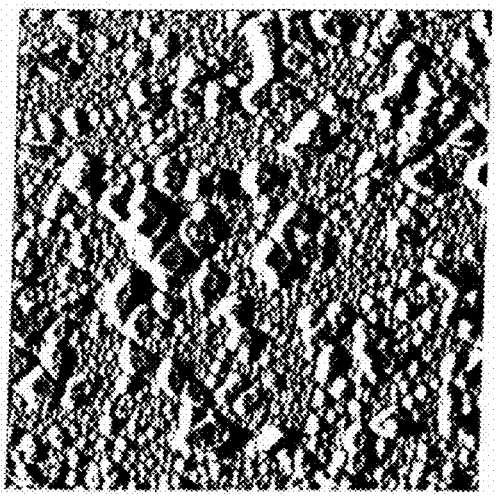
Figure 6:
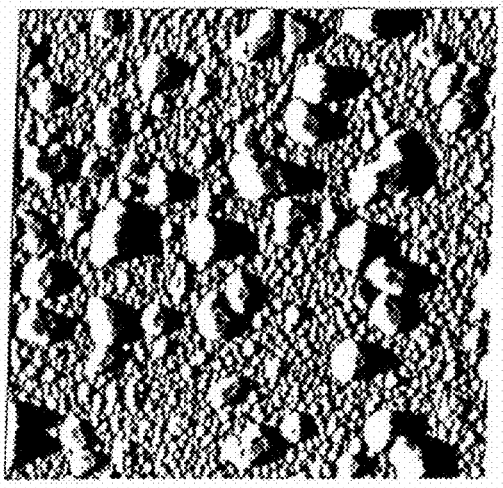
Figure 6:
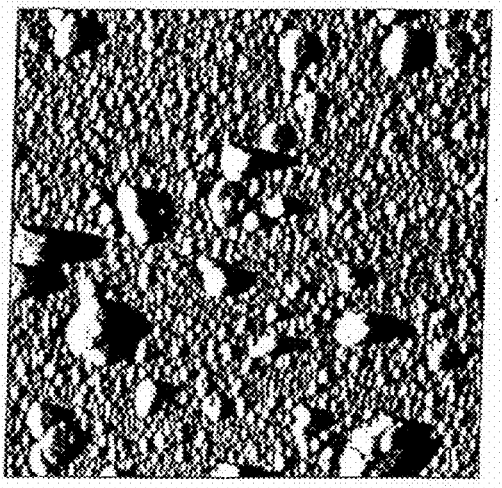
Figure 7:
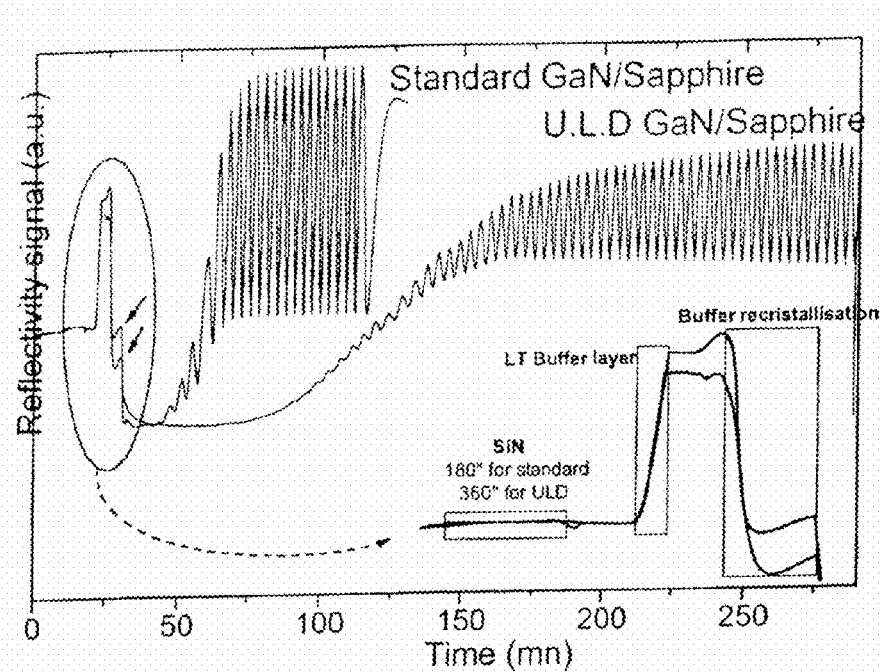
FIG. 7 shows a comparison between reflectivity spectra recorded during the growth of GaN/sapphire standard epilayer and Ultra Low Dislocation (ULD) GaN/sapphire. Arrows indicate where the growth starts.

After the deposition of the GaN layer has been completed, it is annealed at a high temperature of the order of 1080° C. Under the combined effect of the temperature rise, of the presence in the gaseous vehicle of a sufficient amount of hydrogen and of the presence of the very thin silicon nitride beneath the GaN layer, the morphology of said GaN layer undergoes deep modification resulting from solid-phase recrystallization by mass transport. (FIG. 6a). When the temperature approaches 1060° C., it should be noted that the reflectivity of the buffer layer suddenly decreases (FIG. 7, curve standard GaN/sapphire). The initially continuous buffer layer is then converted into a discontinuous layer formed from gallium nitride islands.

At the end of this spontaneous in situ recrystallization process, GaN features or islands of very good crystal quality are obtained, these retaining an epitaxial relationship with the substrate by virtue of the very small thickness of the silicon nitride layer. The GaN features or islands are isolated from one another by regions or the silicon nitride layer is bared. The characteristic heights of the islands are of the order of 240 nm. The observation obtained with a transmission electron microscope shows that the islands tend to take the shape of truncated pyramids.

Figure 13:
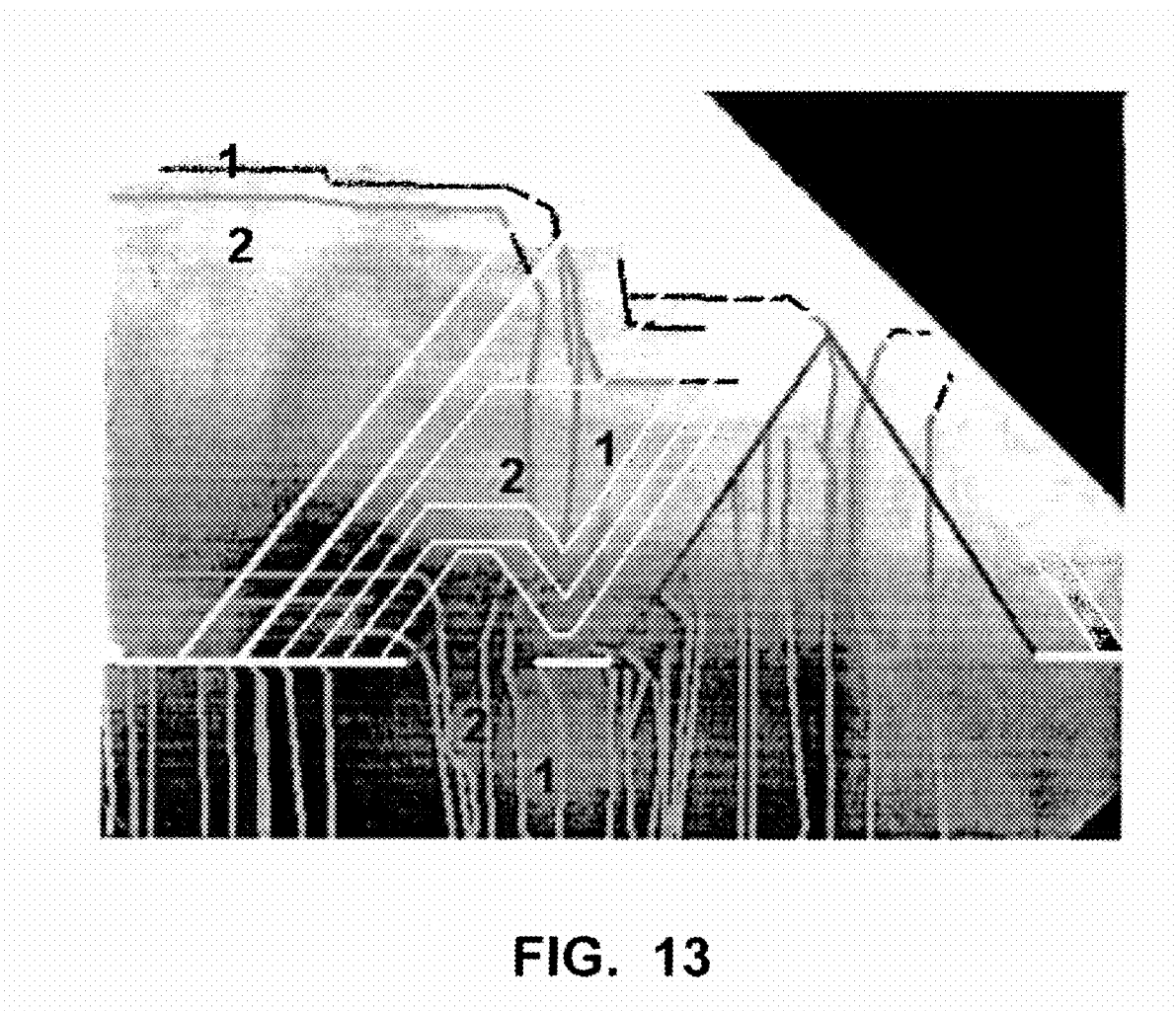
FIG. 13 shows a scanning electron microscope image of the pyramids obtained during growth according to example 1 (comparison example).

FIG. 13 is a scanning electron microscope image of a specimen obtained under operating conditions that are modified so as to increase the dimensions of the islands of micrometric values comparable to those of the islands or features obtained in the apertures of a mask produced ex situ by photolithography.

During the subsequent epitaxial regrowth with gallium nitride on the surface of a specimen, those regions of the silicon nitride that are bare will function as a mask. Explicitly, the GaN features or islands will develop by lateral and vertical growth.

GaN layers have thus been obtained by coalescence of the GaN features having a defect density of the order of $10^8$ cm$^{-2}$, i.e., two orders of magnitude less than that of the defects present in the gallium nitride layers produced using the conventional methods.

Thus, the use of the ex situ process of etching the apertures in a mask may advantageously be avoided and replaced with the in situ spontaneous formation, described above, of the GaN islands or features, the control of their geometry and dispersion not being a prerequisite for improving the quality of the GaN layers formed by this process.

It has been observed that two parameters are of critical importance to induce the 3D growth process: (1) the composition of the carrier gas (N$_2$ or N$_2$+H$_2$) and (2) the duration of the Si/N treatment. The GaN island formation is achievable only when H$_2$ is present in the carrier gas. H$_2$ seems to act as a "morphactant" as explained in D. J. Eagleasham, F. C. Unterwald and D. C. Jacobson, Phys. Rev. Lett. 70, 966 (1993) that called impurities which favor particular equilibrium shapes of islands. Recent studies, namely J. Han, T.-B. Ng, R. M. Biefeld, M. H. Crawford and D. M. Follstaedt, Appl. Phys. Lett. 71,3114 (1997), have also reported that the appearance of islands is strongly related to the H$_2$ concentration in the growth chamber.

GaN epilayers grown following this process show full width at half maximum (FWHM) of X-ray rocking curves in the 180-360 arcsec range (for asymmetric reflections). Hall electron mobilities in the 500-700 cm$^2$/Vs range at 300K, with background carrier concentration in the low $10^{16}$ cm$^{-3}$, were obtained for GaN films grown with an adequate Si/N treatment time. When measuring the PL intensity of 3D GaN layers, an increase in the intensity by a factor of about 20 is observed as compared to the 2D-growth mode. This gain in radiative efficiency is well correlated to the decrease by a factor of about 50 in the dislocation density.

Example 6

Improvement of the Si/N Treatment

The densities of defects in material grown with a 3D mode were reduced down to the mid $10^7$ cm$^{-2}$ ranges as measured by atomic force microscopy by an improved Si/N treatment. Growth experiments were carried out in a 3×2" low pressure MOVPE reactor using trimethyl gallium (TMG) (308 µmole/min) as gallium source, and ammonia for providing N, a V/III ratio of 1305 and H$_2$ as carrier gas. After the Si/N treatment, a low temperature GaN nucleation layer was deposited at 525° C. The NL was then annealed at 1040° C., before proceeding growth at this temperature. The whole growth process was monitored in real time by in situ laser reflectometry, FIG. 7.

The analysis of laser reflectometry curves has been discussed in detail in paper S. Haffouz, B. Beaumont, P. Vennegues and P. Gibart, Phys. Stat. Sol., (a)176,677 (1999). In short, the nucleation layer deposited at low temperature on the Si/N treated sapphire surface experienced a 2D-3D transition as in example 1; this therefore increases the diffuse scattering of the laser beam and results in a continuous decrease of the reflectivity. Afterwards, the growth of GaN proceeds from the islands by lateral and vertical expansion until coalescence. These two stages correspond, respectively, to the profound dip in the reflectivity and to the subsequent recovering of the reflectivity level. In the improved Si/N treatment according to the present invention, the duration of the supply of SiH$_4$ and NH$_3$ lasts 360 sec. During the growth of this kind of samples, the full recovery of the reflectivity takes about 4 hours. The AFM scans in FIG. 6 show the size of the GaN islands for different Si/N treatment durations. These islands are formed after deposition of amorphous SiN from SiH$_4$/NH$_3$ on the sapphire substrate, low temperature deposition of the GaN nucleation layer and the annealing at high temperature. As expected, the size of the 3D nuclei increases with the deposition time of SiN. However, it cannot significantly be increased beyond the shown values because otherwise the recovery time would be too long for practical applications and the epitaxial relationship lost.

The TDs densities of the thick GaN layers grown onto the nucleation layers shown in FIG. 6b were determined by AFM scans and cathodoluminescence mapping. Both methods give comparable values around $7 \times 10^7$ cm$^{-2}$.

In Depth Characterization

1. High Resolution Transmission Electron Microscopy

Figure 8:
FIG. 8 shows a high resolution image of the interface in a ULD GaN/sapphire sample.

Transparent specimens for Transmission Electron Microscopy (TEM) were prepared by low angle ion milling using Ar$^+$ bombardment at 10 kV. The energy of the impinging Ar$^+$ ions was decreased to 3 keV after perforation and even further down to 500 eV in order to minimize ion beam damages. The specimens were investigated in a microscope operating at 300 kV. High resolution images reveal that there is an amorphous region between GaN and sapphire, most likely SiN, (EDS shows some silicon). However, the amorphous material at the interface is a discontinuous layer. Indeed, the interface SiN layer is built of grains (20 nm height and 20-40 nm long). In FIG. 8 two small amorphous inclusions inside the GaN layer at the interface are seen. Actually the amorphous SiN layer acts as a micro-mask, thereby leading to an ELO process at a micrometer scale.

Figure 9:
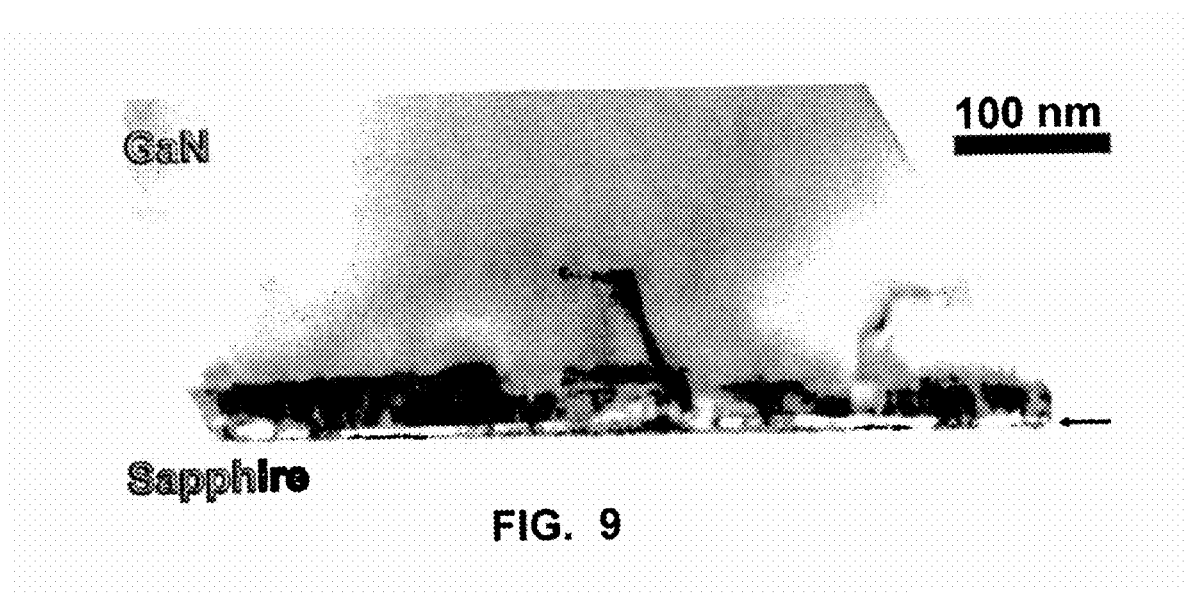
FIG. 9 shows a cross-sectional bright field image of the ULD GaN/sapphire sample showing the interface region and the bending of TDs as in the ELO process.

The amorphous nature of the SiN discontinuous layer can be clearly seen. The partial SiN coverage leads to randomly distributed (in size and location) openings, thereby inducing a lateral overgrowth process. The GaN layer on these "masks" preferentially exhibits the hexagonal wurtzite symmetry and follows the usual epitaxial relationship to sapphire (30° rotation around the [0001] axis). Sometimes a cubic sequence is also observed in grains of the NL between two SiN "inclusions" (FIG. 8). However, these regions are also overgrown by hexagonal GaN. As a further proof of the occurrence of an ELO mechanism, the horizontal bending of threading dislocation occurs during this micro-ELO process as shown in FIG. 9. More precisely, FIG. 9 shows two TDs which propagate parallel to the GaN basal plane after bending.

Plan view samples of the top region of GaN were also prepared for TEM investigations. A dislocation density of $6 \times 10^7$ cm$^{-2}$ was obtained. As AFM probes larger areas, the value of $7 \times 10^7$ cm$^{-2}$ determined by AFM measurements is in good agreement with the TEM data.

2. Cathodoluminescence Microscopy

Spatially and spectrally resolved scanning cathodoluminescence microscopy (CL) has proven to be a powerful method to follow the growth process in ELO through the evolution of the optical properties.

Figure 10:
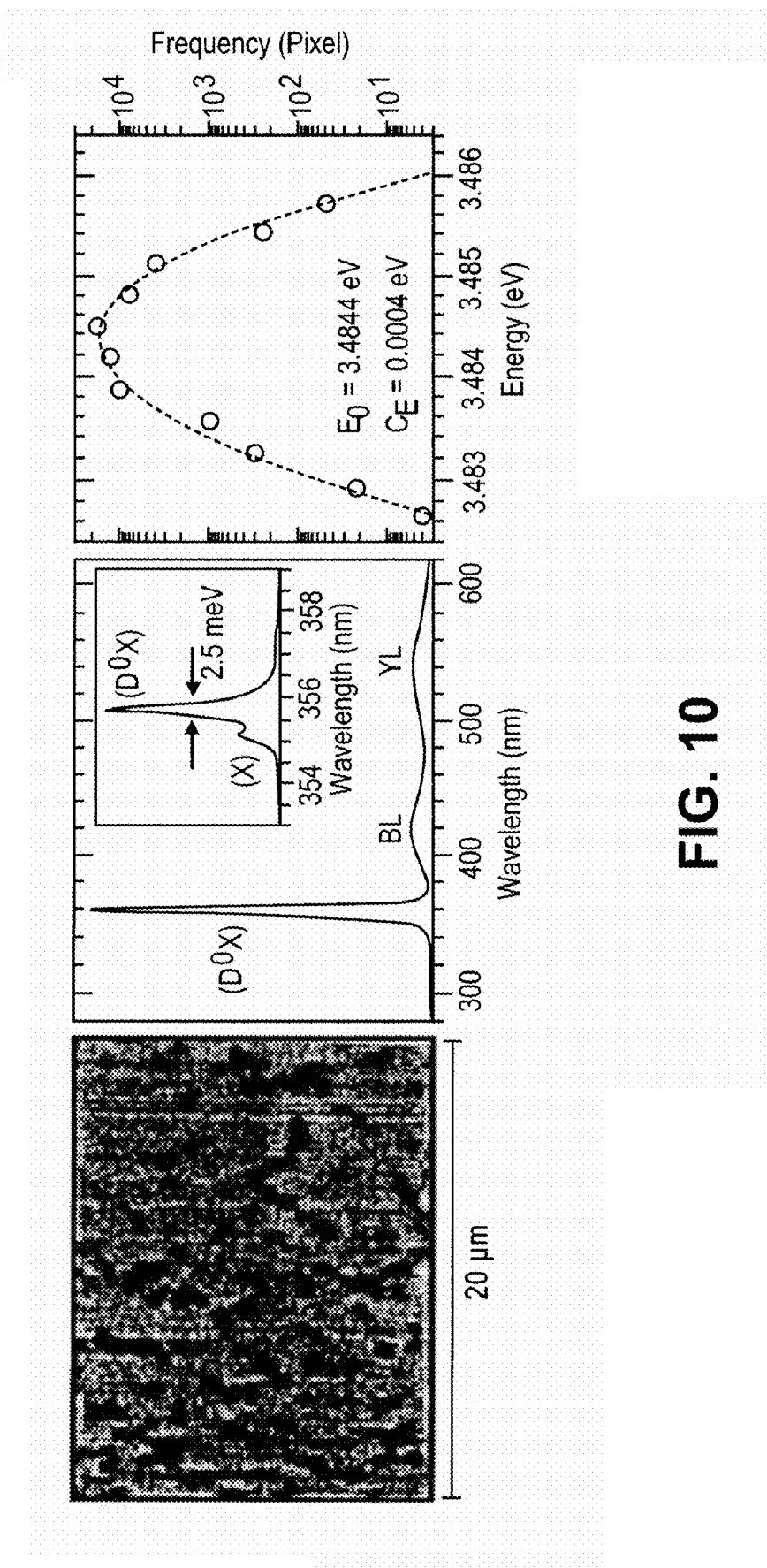
FIG. 10 shows a plan-view CL (T=6 K) of the surface of the ULD GaN/sapphire sample: (a) CL intensity image spectrally integrating from 350 nm to 370 nm, (b) CL spectra laterally integrated over an area of 20 μm×13 μm and (c) fluctuation of the ($D^{ox}$) peak position derived from the histogram of the CL wavelength image of the same area.

CL mappings of the as-grown sample surface give direct access to the distribution of non-radiative defects and sub-micrometer fluctuations of the optical properties. The density of dark spots in the CL intensity image FIG. 10*a* of $5 \times 10^7$ cm$^2$ perfectly corresponds to the TD density measured in AFM, taking into account the slightly lower lateral resolution of the CL signal. As already seen in cross-sectional CL, the surface emission of the sample is dominated by sharp excitonic emission, consisting of (X) and (D$^0$X). The superior lateral homogeneity is proven by the narrow distribution of the (D$^0$X) peak position in FIG. 10*c* which also accounts for the small FWHM=2.5 meV in the large-area spectrum in FIG. 10*b*.

3. Photoluminescence

Figure 11:
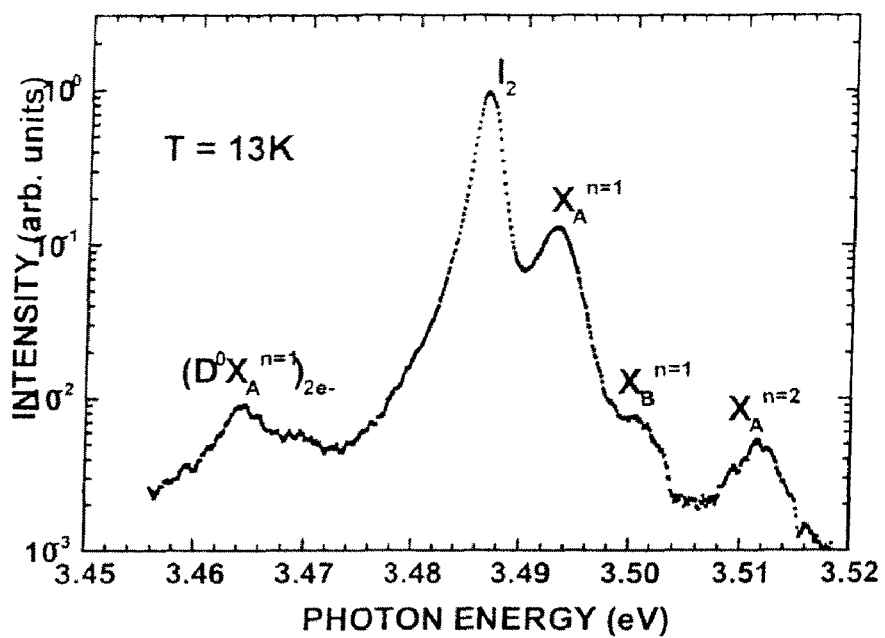
FIG. 11 shows near band gap low temperature photoluminescence of ULD GaN/sapphire.

FIG. 11 displays the near band edge low temperature PL) spectra of GaN/sapphire grown following the present technology. The PL spectrum is dominated by the so-called $I_2$ line, assigned to the donor-bound exciton (D$^0$X), lying≈6 meV below the PL from the 1 s-state of the free exciton with the hole in the A valence band ($X_A$). This assignment is confirmed by the reversal of intensity between these two lines, above T=40 K, due to thermal escape of excitons from the donor traps. The positions of the $X_A$ and $X_B$ lines prove that the layers are under biaxial compression [B. Gil, F. Hamdani and H. Morkoç, Phys. Rev. B 54, 7678 (1996)] thus pushing the $X_C$ exciton towards much higher energies. The line at 3.512 eV is then assigned to the 2 s state of the A exciton. Fluctuations of the strain are certainly the origin of the present broadening of the lines. Nevertheless, apart from the broadening, this spectrum contains many of the features that are usually observed for high-quality homoepitaxial GaN layers [K. Kornitzer, T. Ebner, M. Grehl, K. Thonke, R Sauer, C. Kirchner, V. Schwegler, M. Kamp, M. Leszczynski, I. Grzegory and S. Porowski, Phys. Stat. Sol. (b) 216, 5 (1999); K. P. Korona, Phys. Rev. B 65, 235312 (2002).].

These observations are a further proof of the high quality of the layer.

4. Time-Resolved PL Results

The recombination dynamics of excess carriers in group III-nitrides is a key issue for the optimization of blue-light emitting diodes and laser diodes devices based on nitrides. Therefore, the relationships between growth parameters of GaN and optoelectronic properties are of critical importance.

Figure 12:
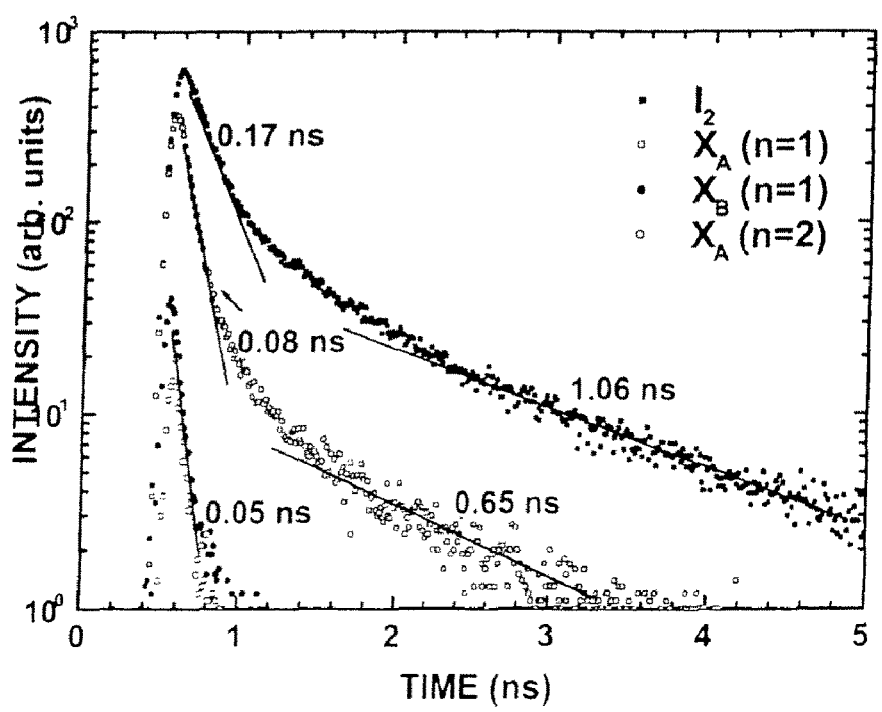
FIG. 12 shows decays of the free-excitons and $I_2$ PL intensities recorded at 13 K.

FIG. 12 shows the PL decays recorded on an ULD layer, at T=13 K, on a time-scale of ≈5 ns. The $I_2$ line exhibits a non-exponential decay with initial decay time of ≈0.17 ns, followed by a much slower and exponential decay, with time constant of 1.06 ns. This result is totally comparable to that obtained on homoepitaxial (dislocation-free) GaN layers. Even more remarkable, the decay dynamics of the $X_A$ line starts with a rather fast exponential decay, with τ≈0.08 ns, again comparable to the homoepitaxy, but it has clearly a long-lived component. The latter could not be observed if the decay was merely controlled by exciton trapping at non-radiative defects, as it is usually the case for lower-quality epitaxial layers. Instead, it is believed that this slow decay may correspond to re-absorption phenomena, or, rather, by the exciton-polariton nature of the recombining entity. This type of property can only be observed for high-quality samples, for which the non-radiative lifetime is much larger than the radiative lifetime. The figure also shows the fast decays recorded for the $X_B$ line and for the 2 s state of $X_A$.

Example 7

Formation of a Free Standing GaN

Using the GaN/sapphire templates of example 1, the HVPE growth starts at about 950° C. In this low temperature step of growing a thick GaN layer by HVPE, the temperature is set at 930-950° C., the partial pressure of HCl, pHCl at 0.03, of NH3, pNH3 at 0.24 (V/III~8), the carrier gas, H2, pH2 at 0.73 respectively. The growing pressure was 2.6 kPa.

After the low temperature step, formation of islands, growth temperature is set up to 1025° C., with the following values for the partial pressures of active and carrier gas:
pHCl, 0.02
PNH3, 0.31 (V/III~15)
pH2, 0.67
Working pressure: 2.6 kPa In these growth conditions, the lateral growth rate is enhanced and the layer becomes flat. CL corresponding to this high temperature growth step appears as grey, because of the high quality of the GaN layer and the reduced incorporation of Oxygen.

The process is repeated several times until a thickness of 500 μm to 2 mm is obtained. CL examination of GaN grown at high temperature reveals first smoothing of the islands features corresponding to high intensity CL emission. Then, when growth becomes 2D, the CL intensity becomes uniform. The FIG. 14 shows an example where the 950-1025° C. alternation has been implemented three times.

SIMS analysis carried out on across section of a thick HVPE layer grown according to the present invention, shows that the oxygen concentration is higher by one order of magnitude in the part corresponding to the coolest growth temperature.

Cross sectional TEM examination on such a free standing GaN exhibits a rather dense network of TDs near the interface. As the thickness, increases, the density of TD decreases. Most of the dislocation appears to bend at 90° into the basal plane as expected.

When the process low-high temperature growth is applied several times, TD density decreases according to the same basic mechanisms at each step.

The substrates are cooled under NH3 environment to avoid decomposition of the GaN layer during the cool-down.

Once the substrates are cooled and removed from the reactor, they can be further processed. The sapphire substrate can be removed from the GaN epitaxial layer by any suitable process.

Free standing GaN obtained according in this first example exhibit TD density of the order of $5 \times 10^6$ cm$^{-2}$ when the low-high temperature growth process is applied only once. The TD density reaches $5 \times 10^5$ cm$^{-2}$ when the low-high temperature growth process is implemented three times as in FIG. 14.

Example 8

Temperature Variations

In this example, three alternate low-high growth temperature growth processes with different temperatures and durations are used. More specifically, it is shown that cross sectional optoelectronic properties of the HVPE layer are linked to the growth process.

The GaN/sapphire templates of example 1, is hereafter introduced in the growth chamber of the HVPE reactor.

The HVPE growth starts at about 930° C. In this low temperature step of growing a thick GaN layer by HVPE, the partial pressure of HCl, pHCl at 0.03, of $NH_3$, $pNH_3$ at 0.24, the carrier gas, $H_2$, $pH_2$ at 0.73 respectively. The growing pressure was 2.6 kPa.

At this rather low temperature, GaN grows in the form of coherent island, randomly distributed with random size, thus involving a ULO process.

After the low temperature step, growth temperature is set up to 1015-1020° C., with the following values for the partial pressures of active and carrier gas:
pHCl, 0.02
PNH3, 0.31 (V/III~15)
pH2, 0.67
Working pressure: 2.6 kPa In these growth conditions, the lateral growth rate is enhanced and the layer becomes flat. The process is repeated several times until a thickness of 500 μm to 2 mm is obtained.

The substrates are cooled under NH3 environment to avoid decomposition of the GaN layer during the cool-down.

Once the substrates are cooled and removed from the reactor, they can be further processed. The sapphire substrate can be removed from the GaN epitaxial layer by any suitable process. Eventually, the thick GaN layer spontaneously delaminates and free standing GaN of several $cm^2$ is obtained. Full 2" wafer are occasionally obtained.

Figure 15:
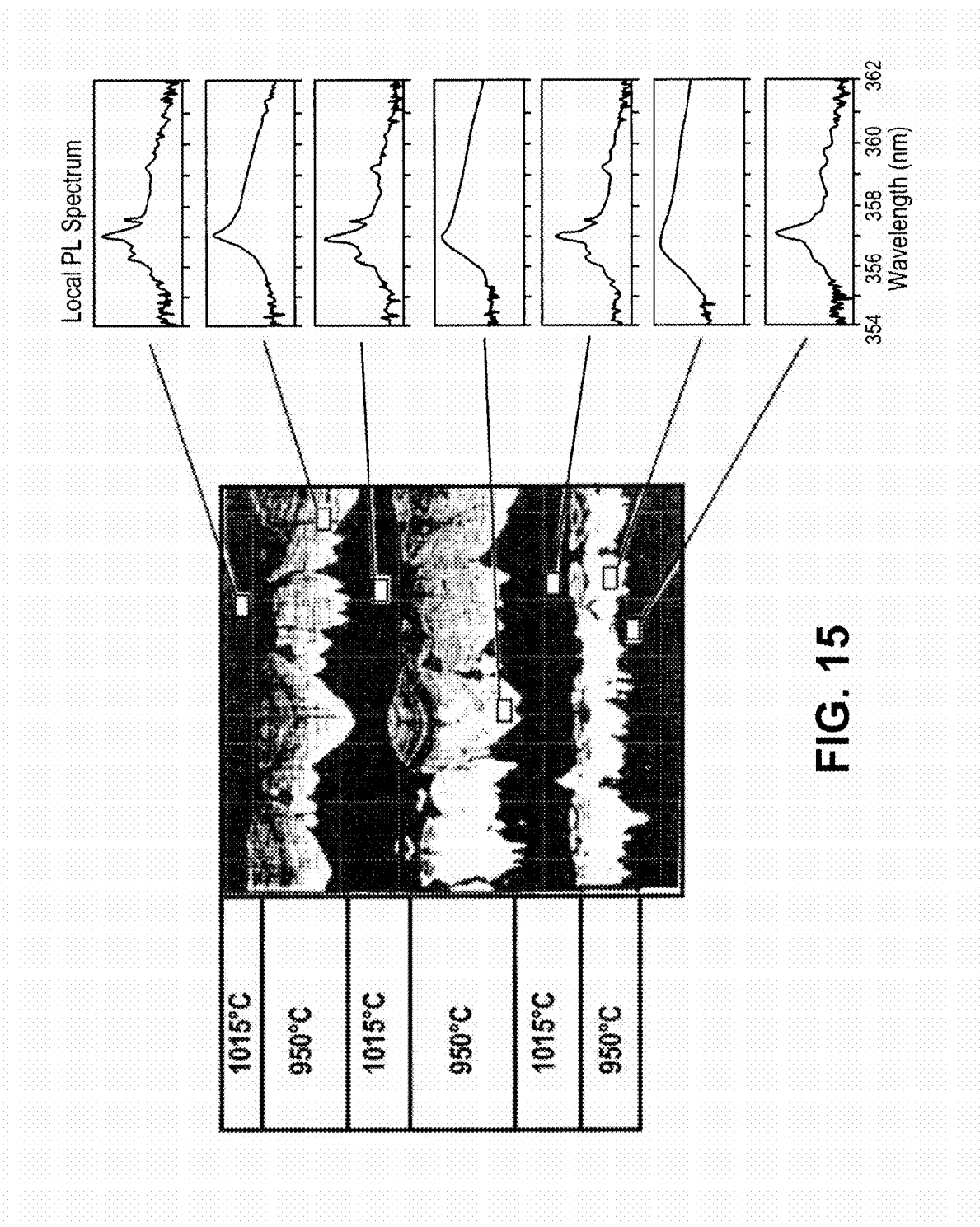
FIG. 15 shows p-photoluminescence of a thick HVPE layer grown following the present invention, at different critical steps of the process.

Free standing GaN obtained according in this first example exhibit TD density of the order of $5\times10^6$ $cm^{-2}$ when the low-high temperature growth process is applied only once. The TD density reaches $5\times10^5$ $cm^{-2}$ when the low-high temperature growth process is implemented three times as in FIG. 15.

Example 9

Variations in Oxygen Pressures

In this example, an antisurfactant is added in the vapour phase. More specifically, Oxygen in the form of diluted $O_2$ in $H_2$ (1%) is introduced in the growth chamber using an additional delivery line. In this specific example the smooth (2D) towards island (3D) transition is tuned by the addition of $O_2$, the growth temperature being kept constant at 1020° C. It is well known that the incorporation of Oxygen is facet dependant, in other words as shown in the previous examples, Oxygen is significantly incorporated on lateral facets whereas the incorporation on c-plane is lower by almost two orders of magnitude.

The GaN/sapphire templates of example 1, is hereafter introduced in the growth chamber of the HVPE reactor.

The HVPE growth takes place at about 1020° C., with the following values for the partial pressures of active and carrier gas:
pHCl, 0.02
PNH3, 0.31
pH2, 0.67
Working pressure: 26 kPa In these starting growth conditions, the lateral growth rate is enhanced and the layer remains flat. Oxygen is introduced at a partial pressure of $7\times10^{-5}$ (Pose/$P_{GaCl}$~0.0035) then because of the antisurfactant effect of Oxygen, this produces roughening of the growing surface by the formation of islands with facets. Then, the Oxygen delivery is stopped. As the antisurfactant is discontinued, the surface becomes flat again. The process can be repeated several times until a thickness of 500 μm to 2 mm is obtained.

The substrates are cooled under $NH_3$ environment to avoid decomposition of the GaN layer during the cool-down.

Once the substrates are cooled and removed from the reactor, they can be further processed as described in example 3. Free standing GaN obtained according in this example exhibit TD density of the order of $5\times10^6$ $cm^{-2}$ when alternative delivery of Oxygen is applied once.

Example 10

Production of a Free Standing GaN Using a Sacrificial Layer

The separation process uses a sacrificial layer of Silicium (Si), although other material could be used, which thickness is 0.3 μm. (111) Si is deposited by CVD on (0001) sapphire. Other crystallographic directions for the Si sacrificial layer like <110> are suitable specifically for the growth of non polar {11-22} a-plane GaN, this however requires R-plane sapphire as starting substrate. Advantageously the (111) Si layer is deposited directly in the MOVPE reactor from pure silane.

Direct growth of GaN on (111)Si by MOVPE does not lead to high quality layers. Conversely, a layer like SiC or AlN has proven to be beneficial for the quality of the GaN layer. Thus 0.15 μm thick AlN layer is deposited on (111)Si by MOVPE using growth process well known by the skilled person in the art.

GaN is grown by MOVPE from trimethyl gallium and ammonia with hydrogen as a carrier gas using well known technologies as described in example 1.

The growth temperature was maintained below 960° C. to avoid premature evaporation of the sacrificial Si interlayer.

According to the present invention the next step is to grow a thick GaN layer by HVPE in such conditions as to significantly reduce the TD density by implementing an ULO process at the very first stage of the growth.

The HVPE growth starts at about 950° C. In this low temperature step of growing a thick GaN layer by HVPE, the temperature is set at 930-950° C., the partial pressure of HCl, pHCl at 0.03, of NH3, pNH3 at 0.24, the carrier gas, H2, pH2 at 0.73 respectively. The growing pressure was 2.6 kPa. Growth is carried out during 10 hours at a growth rate of about 100 μm/h.

At this rather low temperature, GaN grows in the form of coherent island, randomly distributed with random size, thus involving an ULO process.

Panchromatic cross sectional cathodoluminescence (CL) examination of this first stage indeed exhibits an uneven dark layer, which corresponds to the island features formation on top of the MOVPE template (FIG. 16). Conversely, in this first layer, growths further proceeds from faceted islands. In this low temperature regime, the lateral growth rate remains low. More specifically, growth proceeds from faceted islands. CL intensity become much higher and appear as white because the enhanced 0 incorporation on the lateral facets.

After the low temperature step, growth temperature is set up to 1015-1020° C., with the following values for the partial pressures of active and carrier gas:
pHCl, 0.02
PNH3, 0.31 (V/III~15)
pH2, 0.67
Working pressure: 2.6 kPa In these growth conditions, the lateral growth rate is enhanced and the layer becomes flat. Then, when growth becomes 2D, the CL intensity is uniform. The growth further proceeds. CL examination of GaN grown at high temperature reveals first smoothing of the islands features corresponding to high CL emission, and then CL emission becomes uniform. This corresponds to 2D growth of GaN parallel to the basal plane.

The Oxygen concentration as measured by SIMS exhibits the same trend as observed in the first embodiment, the Oxygen decrease by almost one order of magnitude when the growth temperature is 1015° C.

During this second high temperature step, where lateral growth is enhanced, the sacrificial Si interlayer evaporates and a clean separation takes place.

Such a process produces free standing GaN 2" wafers with TDs density in the low $10^6$ $cm^{-2}$ Transmission Electron Microscopy examination on the whole thickness of the sample reveals that the TD density continuously decreases from the initial interface up to the top surface. Bending at 90° of TD is observed as expected in the ULO process.

Instead of growing GaN on Si deposited on sapphire in the MOVPE reactor, commercial Silicon on sapphire (SOS) either on C- or R-plane may be used.

Example 11

Production of a Free Standing GaN Using Ion Implantation to Induce Separation from the Substrate An ELO quality GaN/sapphire template described in example 1 is implanted by ions $H^+$ in such a way that microcavities 5 are created at a depth of 100 nm.

The energies range between 80 and 150 keV and during implantation the GaN/sapphire template is maintained at room temperature. Atomic rearrangements take place between 900 and 1150° C. The $H^+$ fluxes were between $1\times10^{15}$ and $5\times10^{17}$ $cm^{-1}$.

Figure 17:
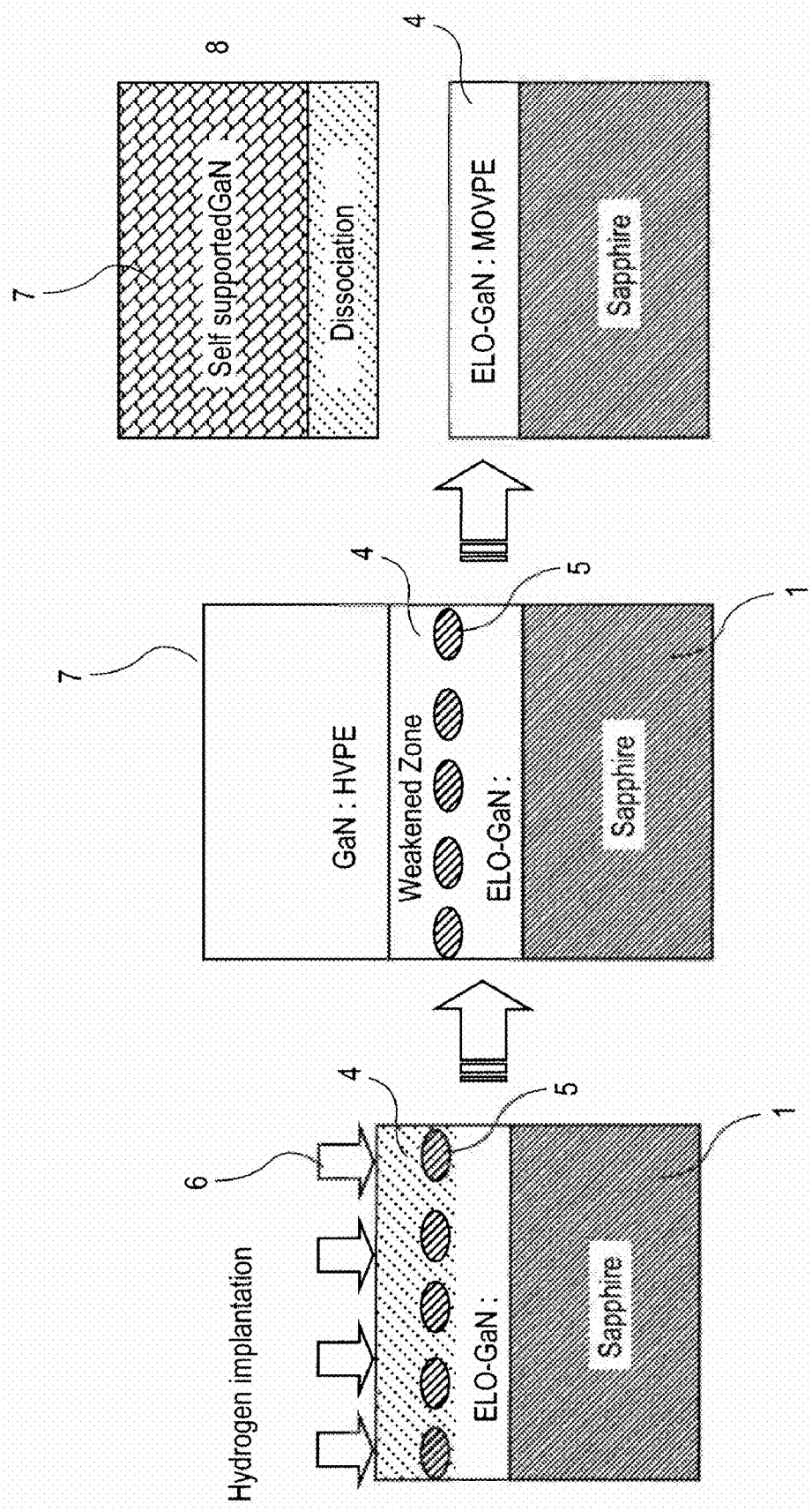
FIG. 17 shows schematic process to produce ULO quality HVPE GaN and to separate the starting substrate by H$^+$ implantation.

This MOVPE layer where H+ has been implanted is then introduced in the HVPE growth chamber. Indeed, even though brittle to some extend due to H+ implantation, this GaN implanted layer can be easily handed. The whole process is schematically shown on FIG. 17.

The HVPE growth starts at about 950° C. In this low temperature step of growing a thick GaN layer by HVPE, the temperature is set at 930-950° C., the partial pressure of HCl, pHCl at 0.03, of $NH_3$, $pNH_3$ at 0.24, the carrier gas, $H_2$, pH2 at 0.73 respectively. The growing pressure was 2.6 kPa. Growth is carried out during 10 at a growth rate of about 100 μm/h At this rather low temperature, GaN grows in the form of coherent island, randomly distributed with random size, thus involving an ULO process.

After the low temperature step, growth temperature is set up to 1015-1020° C., with the following values for the partial pressures of active and carrier gas:
pHCl, 0.02
PNH3, 0.31 (V/III~15)
pH2, 0.67
Working pressure: 2.6 kPa
In these growth conditions, the lateral growth rate is enhanced and the layer becomes flat. Then, when growth becomes 2D, the CL intensity is uniform. The growth further proceeds.

During this HVPE growth taking place at high temperatures, the H+ implanted region induces a self separation which is eventually enhanced during cooling by the difference in thermal expansion coefficient between GaN and sapphire, thus producing spontaneously free standing GaN.

Such a process produces free standing GaN 2" wafers with TDs density in the low $10^6$ $cm^{-2}$.

Instead of growing GaN on Si deposited on sapphire in the MOVPE reactor, commercial Silicon on sapphire (SOS), either on C- or R-plane could be used.

What is claimed is:

1. A method of manufacturing a low defect density GaN material comprising at least two steps of growing epitaxial layers of GaN with differences in growing conditions,
  a. a first step of growing an epitaxial layer GaN on an epitaxially competent layer under first growing conditions selected to induce island features formation, wherein said first step of growing is accomplished without the use of a mask, followed by
  b. a second step of growing an epitaxial layer of GaN under second growing conditions selected to enhance lateral growth until coalescence,
  wherein a temperature of the said second growing conditions is higher than a temperature of the said first growing conditions, and
  wherein the temperature of the first growing conditions is below about 950° C.

2. The method of claim 1, wherein the temperature of the first growing conditions is comprised between about 500° C. and about 950° C.

3. The method of claim 1, wherein the temperature of the second growing conditions is above 1000° C. to about 1080° C.

4. The method of claim 1, wherein the temperature of the second growing conditions is comprised between about 1015° C. and about 1020° C.

5. The method of claim 1, wherein the temperature of the second growing conditions is above 1060° C. to about 1080° C.

6. The method of claim 1, wherein the temperature of the second growing conditions is about 1080° C.

7. The method of claim 1, wherein the temperature of the first growing conditions is comprised between about 900° C. and about 950° C. and the temperature of the second growing conditions is comprised between about 1015° C. and 1020° C.

8. The method of claim 1, wherein the temperature of the first growing conditions is comprised between 450° C. and 600° C. and the temperature of the second growing conditions is about 1080° C.

9. The method of claim 1, wherein oxygen is added to a vapour phase of the first growing conditions to induce island features formation.

10. The method of claim 9, wherein the oxygen is excluded from the second growing conditions to induce enhanced lateral growth.

11. The method of claim 1, wherein oxygen pressure in a vapour phase of the first growing conditions is above oxygen pressure in a vapour phase of the second growing conditions.

12. The method of claim 1, wherein the first growing conditions comprise a temperature of between 900° C. and 950° C. and an oxygen pressure Pose in a vapour phase such that the ratio $Pox/P_{GaCl}$ greater than 0.0005, and the second growing conditions comprise a temperature of between about 1000° C. and 1050° C. without oxygen in a vapour phase.

13. The method of claim 1, wherein Mg and/or Sb is added to a vapour phase of the second growing conditions.

14. The method of claim 1, wherein the epitaxially competent layer comprises a substrate that comprises a base layer and an upper crystalline layer compatible with the growth of a nitride crystal.

15. The method of claim 14, wherein the upper crystalline layer is chosen among the group consisting of sapphire, spinel, GaN, AlN, GaAs, Si, SiC (6H-,4H-,3C-), LiAlO2, LiGaO2, ZrB2, HfB2 and mixtures thereof.

16. The method of claim 15, wherein the upper crystalline layer is an AlN or GaN crystalline material.

17. The method of claim 14, wherein the base layer is a sapphire layer.

18. The method of one of claim 14, wherein the substrate comprises at least one sacrificial layer between the base layer and the upper crystalline layer.

19. The method of claim 1, wherein the low defect density GaN material is a single crystal.

20. The method of claim 19, wherein the single crystal has a thickness of at least 1 µm.

21. The method of claim 19, wherein the single crystal has a thickness ranging from 100 µm to 10 cm.

22. The method of claim 19, wherein the single crystal has a thickness ranging from 500 µm to 3 mm.

23. The method of claim 1, wherein the low defect density GaN material is removed from the epitaxially competent layer.

24. The method of claim 23, comprising a further step of wafering of the low defect density GaN material.

25. A free standing GaN obtainable by a method of claim 1, wherein the measured lifetime of time resolved photoluminescence (TPRL) of the PL peak corresponding to electron-hole plasma under high excitation 0.4 mJ/cm$^2$ at room temperature is higher than 400 ps.

26. The free standing GaN according to claim 25, where the threading dislocation (TD) densities are $10^6$ cm$^{-2}$.

27. The method of claim 1, wherein the temperature of the first growing conditions is comprised between 600° C. and 900° C. and the temperature of the second growing conditions is about 1020° C. to 1080° C.

* * * * *

UNITED STATES PATENT AND TRADEMARK OFFICE
CERTIFICATE OF CORRECTION

PATENT NO. : 8,030,101 B2
APPLICATION NO. : 12/467986
DATED : October 4, 2011
INVENTOR(S) : Eric Frayssinet et al.

Page 1 of 1

It is certified that error appears in the above-identified patent and that said Letters Patent is hereby corrected as shown below:

In the Specification:

Column 7, Line 54: please change "LiAiO2" to -- LiAlO2 --.

Column 12, Line 64: please change "cos(OR)" to -- cos(ΘR) --.

In the Claims:

Column 22, Claim 12, Line 65: please change "Pox/PGaCl greater" to -- Pox/PGaCl is greater --.

Signed and Sealed this
Seventeenth Day of September, 2013

Teresa Stanek Rea
*Deputy Director of the United States Patent and Trademark Office*